United States Patent [19]

Long et al.

[11] Patent Number: 5,173,766
[45] Date of Patent: Dec. 22, 1992

[54] SEMICONDUCTOR DEVICE PACKAGE AND METHOD OF MAKING SUCH A PACKAGE

[75] Inventors: Jon M. Long, Livermore; Rachel S. Sidorovsky, San Jose; Michael J. Steidl, San Jose; Adrian Murphy, San Jose; Bidyut Sen, Milpitas, all of Calif.

[73] Assignee: LSI Logic Corporation, Milpitas, Calif.

[21] Appl. No.: 543,989

[22] Filed: Jun. 25, 1990

[51] Int. Cl.[5] ............................................. H05K 1/18
[52] U.S. Cl. ..................................... 257/687; 257/668
[58] Field of Search ........................ 357/70, 72, 80, 74

[56] References Cited

U.S. PATENT DOCUMENTS

| | | | |
|---|---|---|---|
| 3,435,516 | 4/1969 | Kilby | 29/588 |
| 3,885,304 | 5/1975 | Kaiser et al. | 29/627 |
| 4,139,859 | 2/1979 | Lewis et al. | 357/72 |
| 4,218,701 | 8/1980 | Shirasaki | 357/72 |
| 4,264,917 | 4/1981 | Ugon | 357/74 |
| 4,558,510 | 12/1985 | Tani et al. | 29/588 |
| 4,689,875 | 9/1987 | Solstad | 437/211 |
| 4,771,330 | 9/1988 | Long | 357/80 |
| 4,774,635 | 9/1988 | Greenberg et al. | 361/241 |
| 4,792,843 | 12/1988 | Haghiri-Tehrai et al. | 357/72 |
| 4,814,943 | 3/1989 | Okuaki | 357/72 |
| 4,824,716 | 4/1989 | Yerman | 357/72 |
| 4,843,225 | 6/1989 | Hoppe | 357/72 |
| 4,985,748 | 1/1991 | Belanger, Jr. | 357/70 |
| 5,013,900 | 5/1991 | Hoppe | 357/72 |

FOREIGN PATENT DOCUMENTS

| | | |
|---|---|---|
| 0247644 | 12/1987 | European Pat. Off. . |
| 58-10840 | 1/1983 | Japan ..................... 357/72 |
| 60-154543 | 8/1985 | Japan . |
| 63-114151 | 5/1988 | Japan . |
| WO86/02200 | 4/1986 | PCT Int'l Appl. . |

*Primary Examiner*—Andrew J. James
*Assistant Examiner*—Viet Q. Nguyen
*Attorney, Agent, or Firm*—Skjerven, Morrill, MacPherson, Franklin & Friel

[57] ABSTRACT

A semiconductor device package and a method of making such a package is described. The package comprises a flexible packaging substrate having a patterned metal layer onto which a semiconductor die is attached and a patterned insulative layer attached to the metal layer. The insulative layer includes an annular epoxy-seal gap. A glob of silicone gel is deposited and cured on the die. A casting frame is connected to the metal layer of the flexible substrate on the same side as the die. A backside moisture-blocking layer of material is attached to an opposed side of the tape. The frame and the backside layer are attached to the metal layer of the flexible substrate using cross-linkable epoxy adhesives. These epoxy adhesives join through the epoxy-seal gap to define an epoxy-seal around the die. A thermoset type of molding compound is then poured into the casting frame to define a moisture resistant package body.

5 Claims, 25 Drawing Sheets

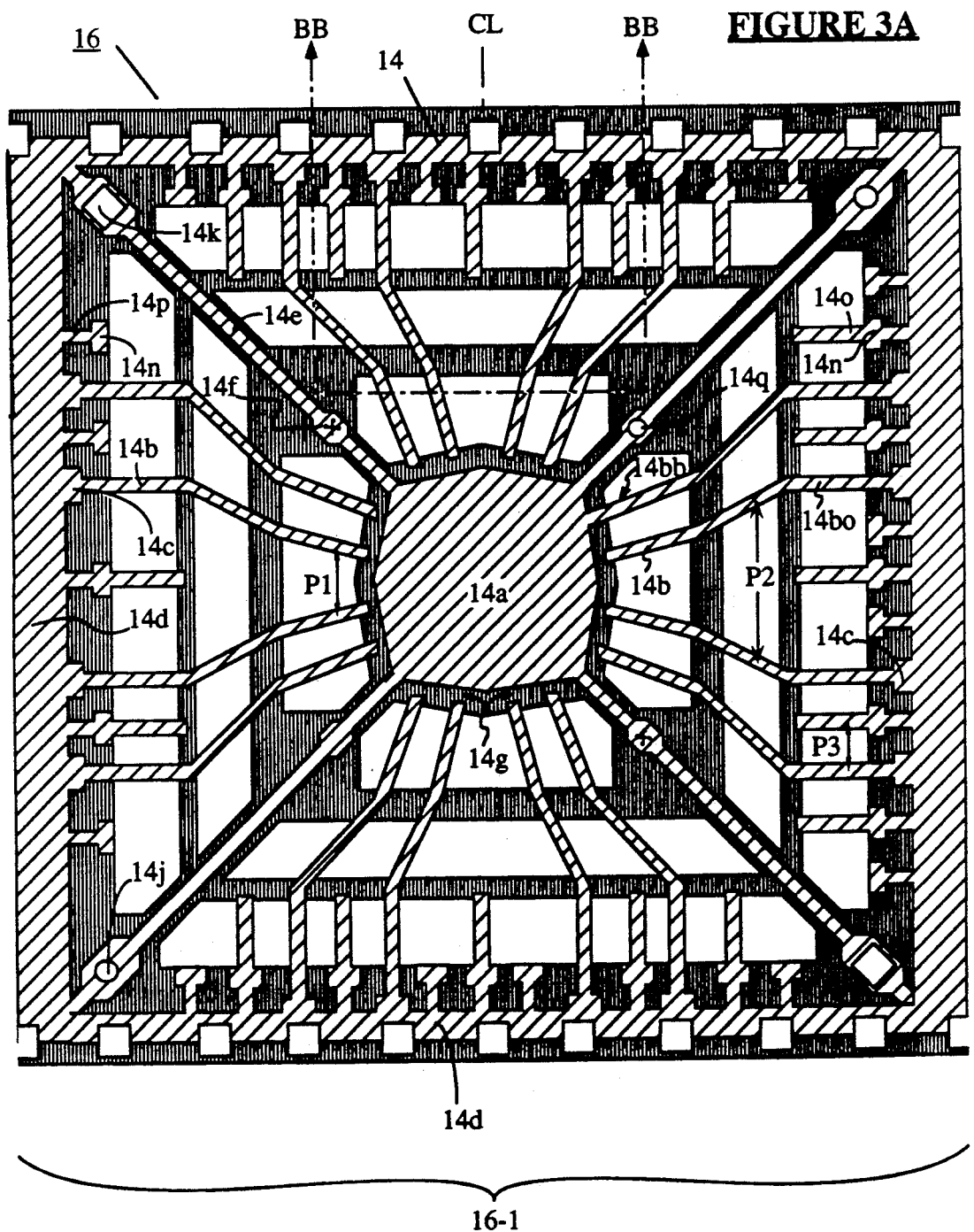

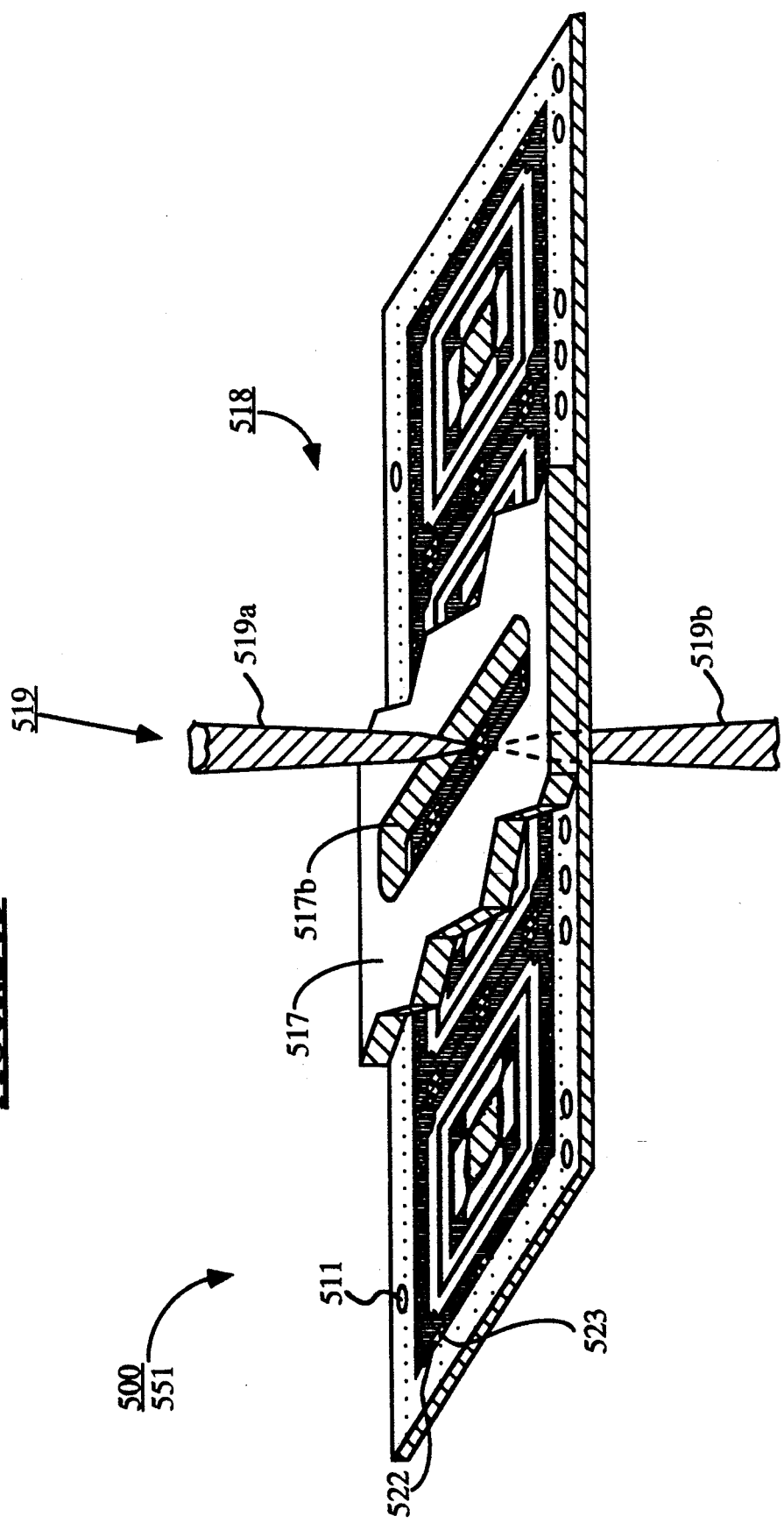

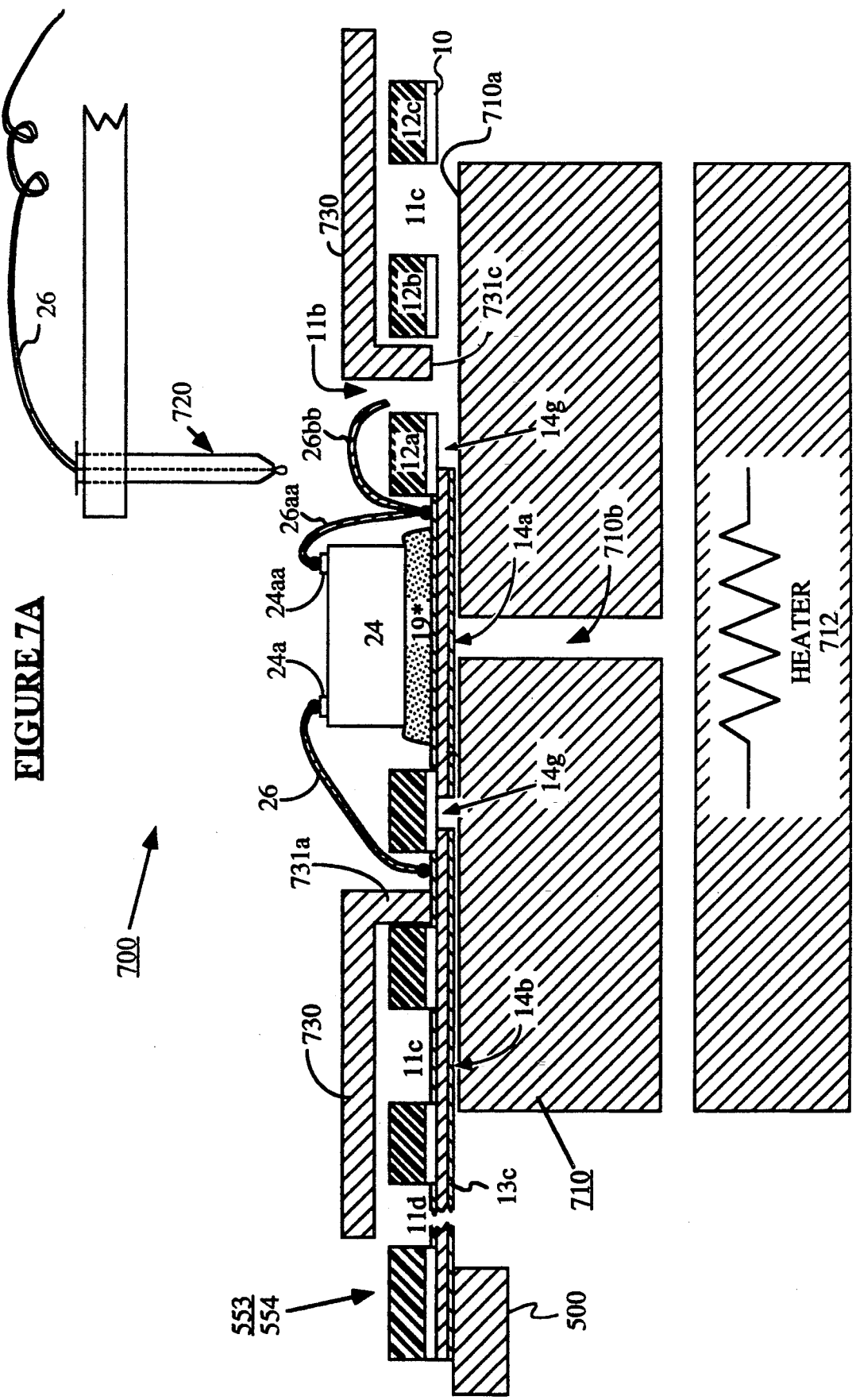

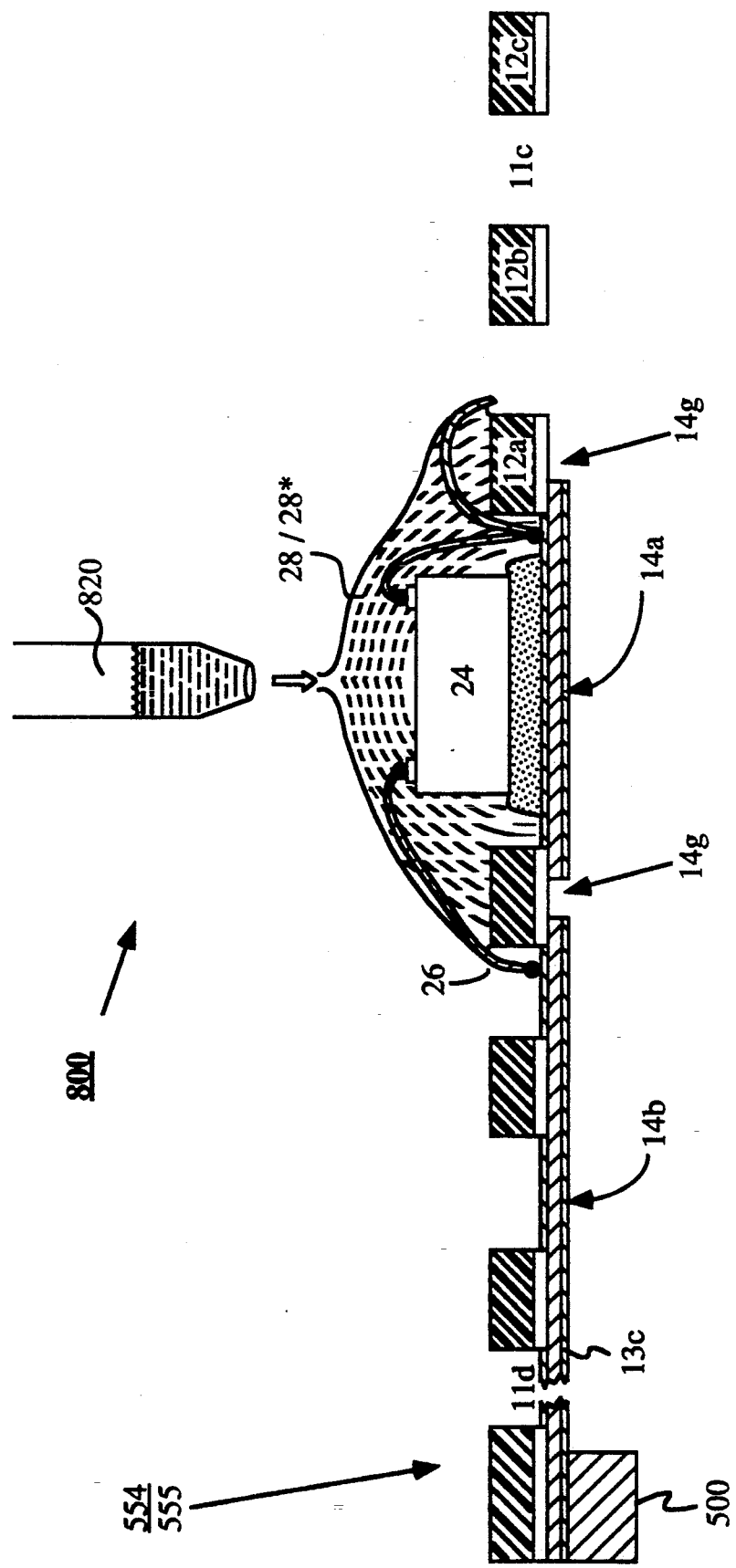

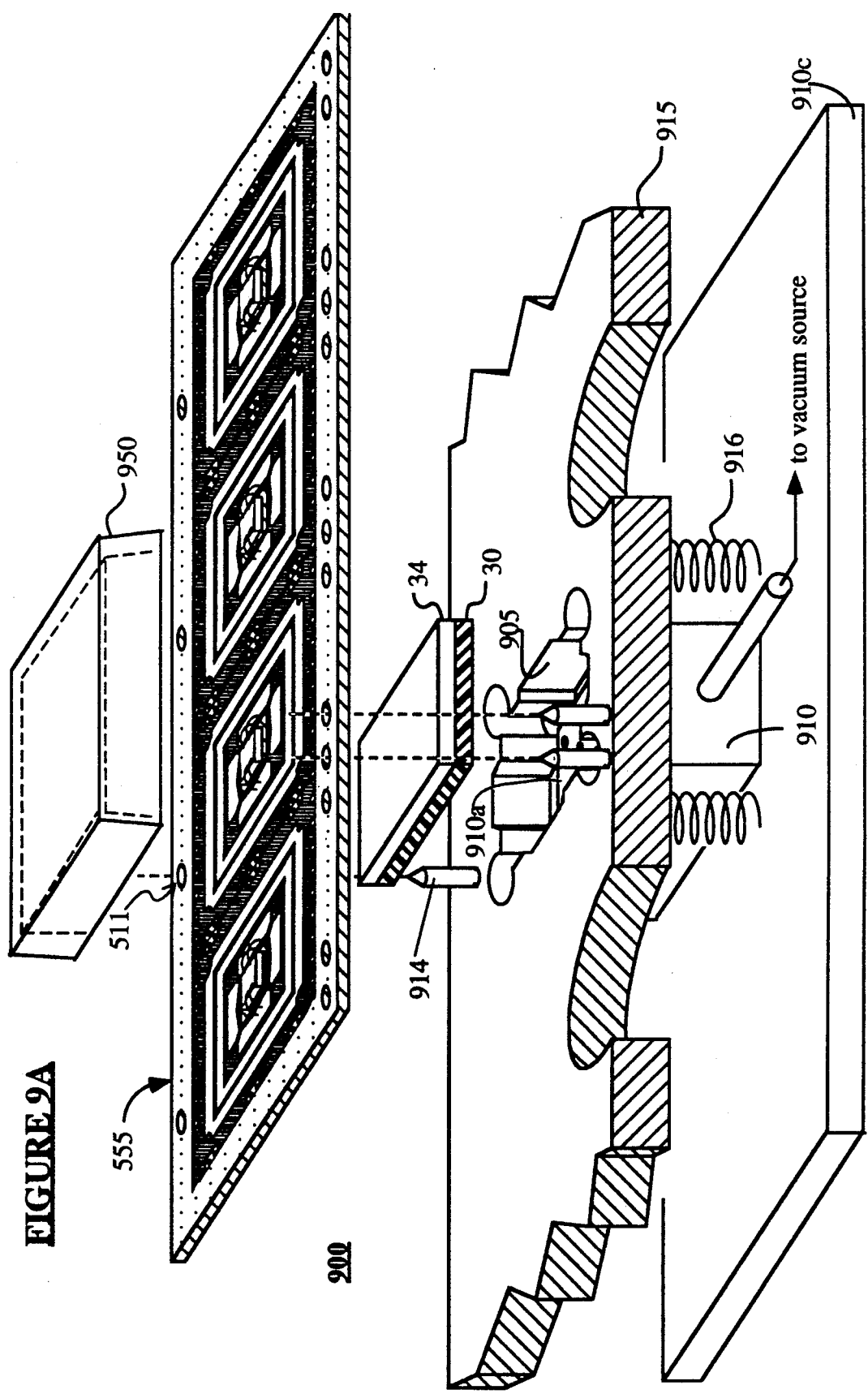

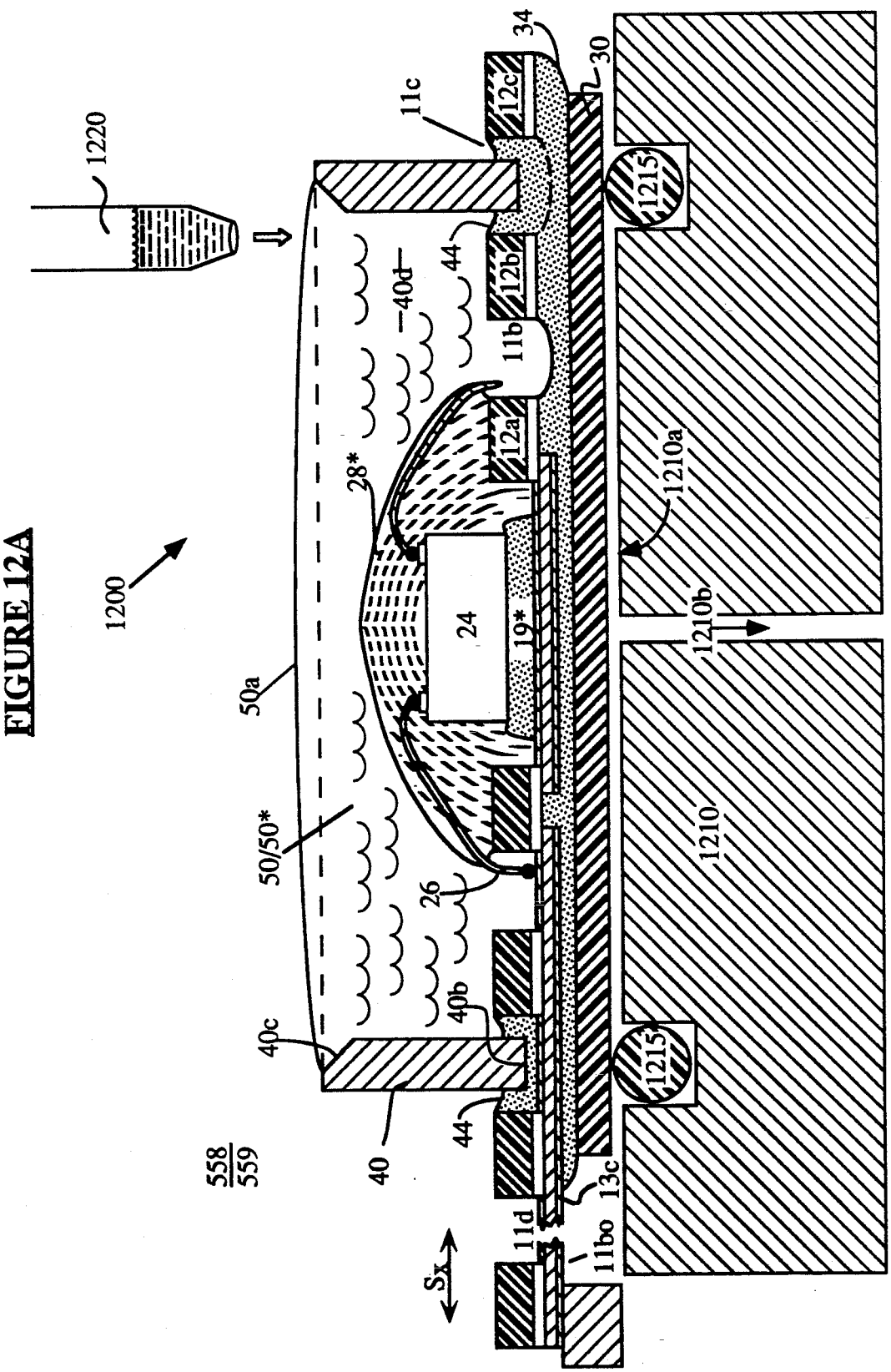

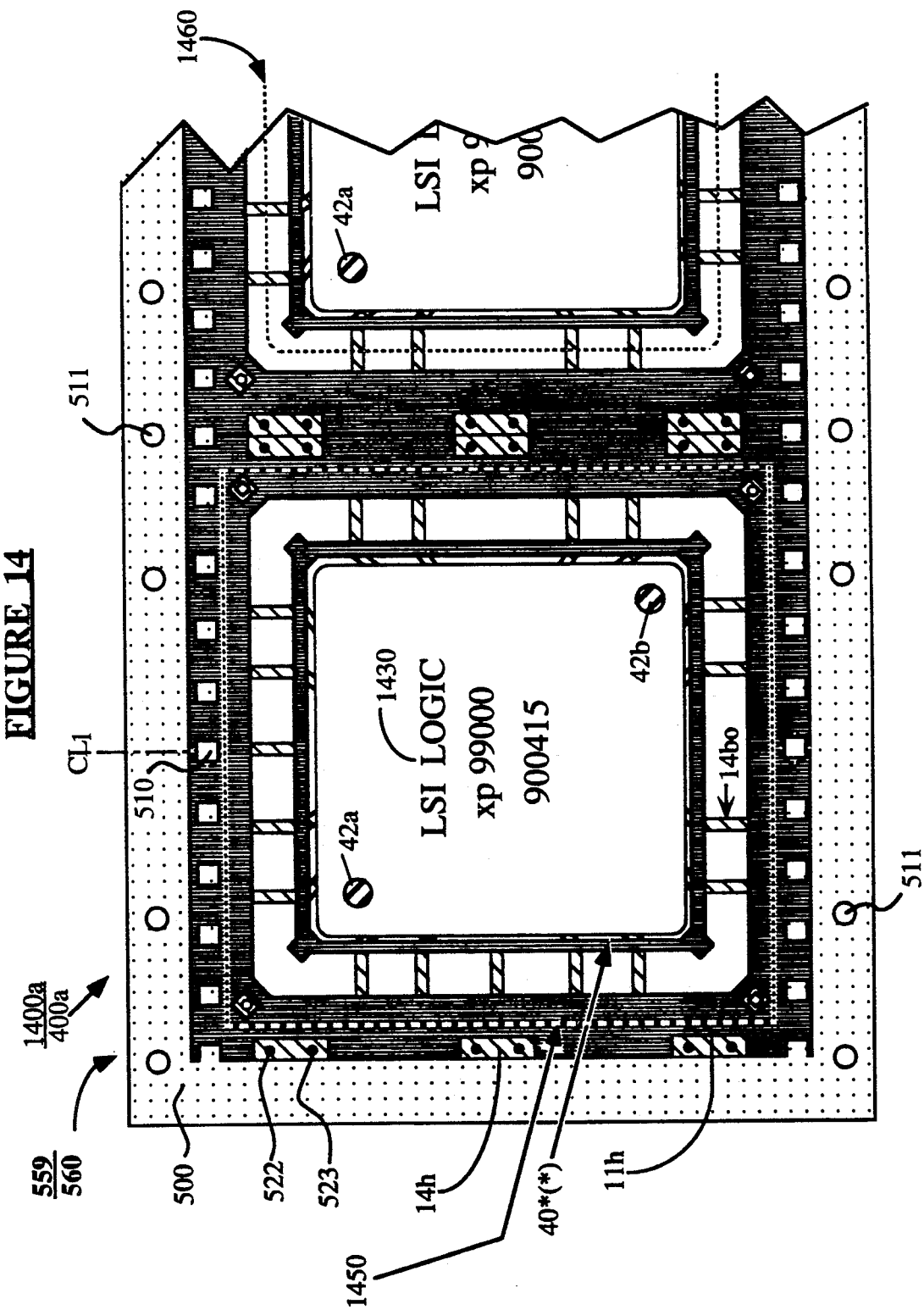

SEMICONDUCTOR DEVICE PACKAGE AND METHOD OF MAKING SUCH A PACKAGE

BACKGROUND OF THE INVENTION

Cross-Reference to Related U.S. Patent Applications

This application is related to earlier filed copending application Ser. No. 07/483,284 filed Feb. 20, 1990. That copending application is a file-wrapper-continuation of application Ser. No. 07/115,228, entitled "Method and Means Of Fabricating A semiconductor Device Package" by Jon Long and Rachel Sidorovsky, filed Nov. 30, 1987, but now abandoned.

This application is further related to copending application Ser. No. 07/380,174, entitled "Strip Carrier For Integrated Circuits" by Jon Long and Michael Steidl, filed Jul. 14, 1989. Both of these related applications are assigned to the assignee of the present invention and their disclosures are incorporated by reference into the present application.

Further incorporated herein by reference are the disclosure of U.S. Pat. No. 4,800,419, entitled "Support Assembly For Integrated Circuits", which issued Jan. 24, 1989 to Jon Long and V. K. Sahakian and the disclosure of U.S. Pat. No. 4,771,330, entitled "Wire Bonds And Electrical Contacts Of An Integrated Circuit Device", which issued Sep. 13, 1988 to Jon Long.

Field of the Invention

This invention relates to semiconductor device packages and methods for fabricating such packages.

Description of the Relevant Art

An integrated circuit (IC) is made of a fragile, brittle and relatively thin piece (e.g., 15 to 20 mils thick) of semiconductor material composed for example of a 250 mil by 250 mil square block of monocrystalline silicon. This piece is commonly referred to as an integrated circuit "die" because it is scribed and broken out from a larger circular disk of similar material which is referred to as a "wafer".

To be commercially usable, the fragile die must be protected during its operating life (normally at least a few years) from excessive mechanical stress and/or strain, from overheating and from attack by moisture or other corrosive chemicals. Protection against mechanical stress is commonly provided in part by attaching the thin IC die to the top of a relatively thicker (e.g., 30 mils thick) support plate.

In so-called "ceramic packaging" techniques, the support plate is usually made of a combination of substantially rigid materials such as ceramics and/or glass An hermetically sealed chamber is formed around the plate-supported die, to protect the die from corrosive chemicals (e.g., moisture and acids), by covering it with a cylindrical "can" made of ceramic and/or metal. The can is hermetically sealed to the top of the rigid support plate with melted glass or a ceramic cement. Electrically conductive terminals or "lead fingers" extend along the rigid support plate from inside the package through the sealed chamber to the outside to thereby couple the enclosed IC to external circuitry. Fine bonding wires made of aluminum or gold usually connect enclosed inner portions of the lead fingers to bonding pads provided on top of the die.

In so-called "plastic packaging" techniques, a relatively rigid or semi-rigid "lead frame" made of a 6 mil or thicker layer of metal supports the die. A plastic material encapsulates the die and "lead finger" portions of the lead frame.

The rigidity and sealing characteristics of the materials which form a package around the die should protect the die and its fine bond-wire connections from excessive mechanical stress and/or electrical shorts and/or corrosion so that electrical circuitry within or on the die can function as intended.

Electrical circuitry within or on the die is formed by chemically altering (e.g. by ion implantation of impurities) and/or otherwise modifying (e.g. lithographically etching) the top surface of the die to define thereon a large number of tiny electronic elements such as transistors, resistors, conductive interconnects and so forth. Metallic contacts to the semiconductor material of the die are provided by depositing materials such as doped polycrystalline silicon and one or more relatively thin metallization layers composed for example of aluminum. The metallization layers often include a large number (i.e., 16 or more) of closely spaced "bonding pads" to which bonding wires are attached so as to electrically connect the integrated circuitry of the die to external circuits. For proper operation of the integrated circuit, the electrical connections between the die and its external circuits must not be either broken or shorted during the operating lifetime of the IC.

Sometimes it is necessary to provide an electrical connection between a bottom or "backside" surface of the die and external circuitry. This bottom connection supplies a ground or other biasing voltage to the bottom portion of the die. When such backside biasing is required, the integrity of the "backside" connection from the die bottom to external circuitry must also be maintained throughout the operating lifetime of the IC.

The traditional method for making a backside connection, and at the same time reinforcing the mechanical strength of the die, is to provide a substantially rigid plate of metal, referred to in the industry as a "die-attach" pad or paddle, and to bond the bottom side of the die to the die-attach pad using a thermally and electrically conductive die-attach adhesive. By way of example, conventional die attachment methods are disclosed in U.S. Pat. No. 4,774,635 "Semiconductor Package With High Density I/O Lead Connection" issued Sep. 27, 1988 to Greenberg et al. (hereinafter Greenberg '635) and in U.S. Pat. No. 3,435,516 "Semiconductor Structure Fabrication" issued Apr. 1, 1969 to Jack S. Kilby (hereinafter Kilby '516).

Integrated circuits are used in a wide variety of applications, including commercial and military. These applications present varying types of hazards to the fragile IC die, and in response, a number of different packaging schemes have been developed to provide varying degrees of protection. The amount of protection provided depends on the types of hazards which the integrated circuit is expected to face and on the cost which users are willing to bear for obtaining such protection. In some life-critical applications (i.e., military and medical), cost is not of prime concern and relatively expensive materials and manufacturing techniques may be used to provide protection. In general purpose kinds of applications, cost is a prime concern and competitive forces within the industry favor the least expensive packages which provide an industry-specified level of protection.

Aside from meeting industry-specified standards of protection, state of the art packaging schemes must accommodate relatively high pin counts and densities which are called for by modern circuit designs. Older style packages were designed to provide fewer than 100 connections (pins) between the internal die and external circuitry. Typically, the older pin counts were on the order of 16, 48, or 64 pins. The package footprint was relatively large and thus the allowed pin to pin spacing was wide, i.e., 0.100 inch pitch. The newer, so-called LSI (Large Scale Integration) and VLSI (Very Large Scale Integration) designs call for pin counts well above 100 pins per package (i.e., 164 to 444 pins per package), and for pin to pin spacings well below 100 mils (i.e., lead pitches as small as 0.010 inch with lead edge-to-edge spacings as low as 0.006 inch). The newer designs simultaneously call for relatively small footprints (i.e., a square of 1.33 inches or less as specified for example by JEDEC Publication MO-102). Thus substantially higher pin densities are required. Also, where a plurality of printed circuit boards are to be placed in closely spaced slots, a relatively small package height (i.e., less than 200 mils) is desirable.

Many packaging schemes are unable to meet these requirements for high pin counts, high pin densities and small package size. For those schemes that can, the higher pin counts and densities usually result in undesirably high costs for manufacturing the package. And package manufacturing cost is only part of the overall picture. The higher-density packaging schemes further need to be compatible with automated board mounting techniques which have become standard in the industry (e.g., vacuum-powered pick and place combined with wave soldering or hot bar soldering). If a packaging scheme is not compatible with such board-mounting techniques, end users have to bear the additional cost of building specialized board mounting machines that are matched to the noncompatible packaging scheme.

The more conventional packaging schemes for integrated circuit devices include plastic encapsulation and ceramic hermetic-seal types of packaging. Ceramic packaging is disclosed for example in Kilby '516 (cited above). A form of plastic encapsulation referred to as "one-piece transfer molding" is illustrated in Greenberg '635 (cited above).

To protect the IC from chemical attack, it is desirable to block moisture and other corrosive chemicals from entering the package and reaching delicate interconnections made at the top and bottom of the IC die. While the hermetically sealing materials of ceramic packaging techniques often provide better protection against moisture penetration than do the potting compounds of conventional plastic encapsulation schemes, the ceramic packaging techniques tend to be far more expensive. Ceramic packaging techniques are relatively complex and expensive because they require a plurality of high temperature firing processes to sinter together various layers of ceramic, glass and/or metal in order to form a true hermetic seal around the die.

The manufacture of plastic packages, on the other hand, is relatively simple and inexpensive. Quad flat-pack packages, as for example those shown in Greenberg '635, start with a "semi-rigid" metallic lead frame. The term "semi-rigid" is applied here to metal layers having a thickness of 6 mils to about 30 mils. Above 30 mils, metal layers are considered relatively rigid while at thicknesses well below 6 mils, such layers are considered relatively flexible.

A semi-rigid lead frame such as illustrated in Greenberg '635 comprises an outer support ring, a plurality of integral "lead fingers" extending inwardly from the outer ring and a central die-attach pad which is suspended by some of the lead fingers. All features of such a semi-rigid integral lead frame are defined from a solid sheet of metal having a thickness in excess of 6 mils. This thickness is necessary to give the lead frame mechanical strength but it is at the same instance detrimental because it limits the narrowness to which individual lead fingers can be defined and the minimum spacing allowed between such lead fingers.

Semi-rigid lead frames are typically fabricated in mass volume using a punching method to minimize their cost. Each punched out section is pressed into a self-sustaining, flat form. A typical lead frame is composed of a copper alloy approximately 6 to 30 mils thick. A thin layer of silver is spot-plated onto the copper alloy surface after the lead fingers are defined to enable a thermosonic wire bonding step which later follows in the packaging process. The outer support ring of the lead frame is usually square shaped. As many as 64 integral lead fingers extend inwardly from all four sides of the outer ring toward a square center area approximately 300 mils by 300 mils in which the die attach pad is positioned. It is difficult to provide substantially more than 64 lead fingers because the semi-rigid lead frame is too thick to permit the definition of more lead fingers around the small perimeter of the center area. Typically, at least four of the lead fingers extend radially inward to join continuously with and support the central die-attach pad at its corners. The center pad is thereby suspended within the center area of the lead frame. The remaining plurality of lead fingers are not physically continuous with the center pad, but instead are separated from the center pad by a small gap.

After the semi-rigid lead frame is fabricated, the integrated circuit die is attached to the center pad using a silver-filled epoxy adhesive. Bond wires made of fine gold or aluminum threads are then connected between the contact pads at the top of the die and silver-plated inner ends of the lead fingers to provide electrical continuity. The central die-attach pad is electrically coupled to the outer ring of the lead frame by its four supporting lead fingers or by using down bond or jumper wires.

The resulting assembly is encapsulated by suspending it in the cavity of a pre-fabricated two-part rigid mold. The rigid walls of the mold cavity surround all surfaces of the integrated circuit but outer ends of the radially extending lead fingers are allowed to protrude out of the cavity between top and bottom halves of the mold. The outer ring portion of the lead frame is also left outside the mold cavity.

A hot plastic material (potting compound) is then injected under pressure into the mold cavity so as to fully surround the IC die and cover its top, bottom, and side surfaces. Inner ends of the lead fingers are also encapsulated by the potting compound. The injected plastic is then cured within the confines of the mold cavity and cooled therein to produce a plastic body which takes on the shape of the mold cavity and which encapsulates the integrated circuit die, the die-attach pad, the bond wires, and a short inner length of the lead fingers. This process is commonly referred to as transfer molding.

Subsequent to the transfer molding step, the mold is opened, the packaged device is removed from the mold and its outer ring portion is cut away from the lead frame in a manner that leaves the outer portions of the lead fingers individually protruding from the plastic body for a specified distance. The outer leads are then typically "formed" by bending them at right angles a short distance from the sides of the plastic body to place the package in condition for mounting onto a printed circuit board (PCB). The outer leads retain their bent form as a result of the semi-rigidity of the original lead frame. It is desirable that the outer leads remain in a fixed and predefined spatial orientation to one another. The top of the plastic body should remain relatively flat. This allows vacuum-operated pick and place equipment to later align and automatically mount the packaged device onto a predefined printed circuit board.

The above cited U.S. Pat. No. 4,771,330 to Jon Long discloses a composite package assembly which is fabricated with a semi-rigid lead frame but which has a thin flexible tape-like structure at its center. The tape-like structure is configured to have thin flexible lead fingers that are connected to inner ends of the semi-rigid lead fingers of the lead frame. The semiconductor device is assembled onto the thin flexible tape-like structure and is wire bonded to the flexible lead fingers. The advantage of this construction is that a smaller pitch can be tolerated between the thin inner lead fingers and higher pin counts can be realized. Encapsulation of the composite assembly uses the standard two-section transfer mold to enclose the semiconductor device, the semi-rigid lead frame, tape-like structure, wire bonds and conductive leads in a suitable molding compound.

Despite prolonged experience with the transfer molding process, the initial yield of electrically operative ICs after plastic encapsulation but before mechanical qualification is only moderate (approx. 95% at best), while the operative yield after a variety of mechanical qualification tests are performed is quite low in comparison with ceramic packages whose yields are in the 98-99% range. Qualification testing of packaged semiconductor devices is often quite rigorous to assure that the packaged devices can survive the harsh environments of their intended applications. Packaged devices might have to survive temperatures as high as 125° C. or 150° C. for up to 1000 hours while the device is electrically biased. Also, the packaged devices might be exposed to 1000 or more cycles of temperature modulation between, for example, the −55° C. and +125° C. temperature levels.

If the glass transition temperature $T_g$ of the molding compound (temperature at which the compound shifts from an elastic to a plastic deformation regime) is close to the upper end of this −55° C. to +125° C. range (usually $T_g$ is approx. 130° C. or higher) the molding compound might expand and contract at two substantially different rates, one rate being at a temperature well below the glass transition temperature and more significantly, another higher rate of thermal expansion being at a temperature close to the glass transition temperature $T_g$. The lead frame fingers and die-attach pad tend to expand and contract at substantially different rates during temperature cycling while the semiconductor and metallic materials of the IC die tend to expand and contract at yet different rates. After 1000 cycles of expanding and contracting at different rates, significant stresses can build up within the package.

The accumulated stresses and strains of temperature cycling are believed to create microscopically sized cracks (microcracks) in the plastic encapsulant, predominantly in the regions where the relatively rigid ("semi-rigid") lead fingers extend through the molding compound When humidity and pressure cooker tests follow (as described below), the microcracks can allow moisture in. This hastens corrosion and failure of moisture sensitive components within the package. The present inventors have found that corrosion increases as the thickness of a conventional one-piece plastic encapsulating body decreases. This phenomenon makes it difficult to simultaneously produce a low profile package (e.g., height less than 200 mils) using conventional encapsulation techniques and to assure that the device will later pass the humidity and pressure cooker qualification tests.

Humidity tests are typically performed at 85° C. to 95° C. in a relatively humid environment of 80% to 95% relative humidity for 1000 hours or more while the device is electrically biased. The pressure cooker tests are typically performed in a pressure pot chamber at temperatures of 120° C. and under 2 atmospheres of steam for 168 hours or more depending on whether the device must meet military or commercial requirements.

As a result of such exposures, packages which have already developed a large number of microcracks during the temperature cycling tests now admit moisture and water-carried corrosive chemicals (e.g., acids) into their interiors. Once moisture enters the package and the device is further tested under electrical bias, dendritic growths begin to form within the package from shorting metals found within the package materials. Silver, for example, is notorious for its tendency to generate dendritic shorts within the package. A source of silver can be typically found in the silver filled conductive epoxies that are used for the die attach adhesive. Over time, the dendritic growths extend between and short otherwise separated conductors of the package. Moisture also accelerates the corrosion of reactive components within the package such as the aluminum bond pads on the semiconductor substrate (die). Aluminum is readily susceptible to corrosion by corrosive agents, such as the outgassing products of organic compounds (i.e., the plastic encapsulant used as the molding compound and some epoxy adhesives). Outgassing can be substantial during high temperature exposures. Some plastics and epoxy adhesives can generate outgas byproducts containing chlorine and ammonia, these can in turn produce reactive Lewis acids, which will readily attack aluminum and other metal conductors found on the IC die.

Despite these problems, there is a strong desire in the industry to continue to use plastic materials for packaging in place of ceramics because most encapsulation plastics are relatively easy to mold into desired shapes and are relatively inexpensive. On the other hand, these same plastics tend to be hydrophilic, moisture penetrable and thus not highly effective in sealing the IC from moisture Also, the more commonly used plastic encapsulants readily become fatigued and are not able to withstand the stresses of rigorous qualification testing without cracking at the microscopic level. Such cracking reduces the ability of plastic packages to keep moisture out.

Accordingly, the industry is caught in a dilemma. One side prefers to move away from plastic encapsulation and towards ceramic packaging because ceramic packaging provides superior protection. The other side prefers to stick with plastic encapsulation because of its lower costs. Even though the cost of ceramic packaging is prohibitive for general-purpose uses, the higher pin counts required by LSI and VSLI chips bias all in the industry to accept ceramic packaging as the method of choice despite its high cost. Pin counts as high as 300 pins or more may be required for devices having die footprints as small as 200 to 300 mils square or less. Increasingly smaller spacings between package pins are needed to satisfy these requirements. The conventional semi-rigid lead frames which are used in plastic encapsulation cannot be miniaturized to accommodate such requirements because their thickness places a lower bound on line width. Therefore, the industry has in large turned its focus to the more expensive ceramic packaging techniques which use materials such as ceramic and Kovar, for the die support and lead fingers respectively. Examples are pin-grid arrays and multichip assemblies. Ceramic packaging techniques allow for finer line definitions and tend to produce better yields after environmental qualification testing than do the conventional plastic encapsulation techniques. However, the cost of using ceramic-compatible materials continues to be relatively high and the cost of automating packaging processes which use these materials is still considered a problem.

A reliable and durable packaging alternative is needed to accommodate the high pin counts of the newer, more complex LSI and VLSI designs. The alternative should perform well during environmental stress qualification testing and yet provide a high yield of operative products, at relatively low cost.

SUMMARY OF THE INVENTION

It is an object of the present invention to provide a packaging technology which is scalable to accommodate the increasing pin counts and densities of newer semiconductor device designs while keeping packaging costs at acceptable levels.

The present invention allows packages to be scaled for higher pin counts and/or smaller footprints by defining lead fingers from a flexible metal layer which is much thinner than previous semi-rigid lead frames. Strength is provided by laminating the metal layer to a relatively strong insulative layer. Packaging costs are minimized by using so-called tape-automated manufacturing techniques throughout the process in which an integrated circuit die is packaged.

According to a first aspect of the present invention, an IC die is attached, during formation of an IC package, to the top surface of a flexible die-attach pad. The die attach pad is made of a conductive metal region which is defined centrally on a relatively flexible packaging substrate having a thin (flexible) metal layer that is laminated to an overlying, thin (flexible) insulative layer. The insulative layer reinforces the mechanical strength of the metal layer. A die-attach window is defined through the insulative layer to expose the top surface of the die-attach pad for die attachment. A continuous ring-shaped gap, which is later referred to as an epoxy seal gap because it is filled with moisture blocking materials, is further defined in the insulative layer to surround the die-attach pad and separate a central portion of the insulative layer from an outer portion of the insulative layer. The inner portion of the insulative layer supports the die-attach pad. The inner portion further functions as a first encapsulant "dam" which blocks the spreading of a soon-to-be mentioned first encapsulating gel.

The flexible metal layer of the packaging substrate is patterned to include fine lead fingers which span across the ring-shaped gap of the insulative layer. The lead fingers are anchored to the inner and outer portions of the insulative layer to thereby flexibly and/or elastically join the inner portion of the insulative layer to the outer portion. The die is thereby flexibly suspended at the center of the substrate. This flexible suspension arrangement helps to relieve and minimize stress build-up during a later encapsulant curing stage. Because the metal layer of the packaging substrate is relatively thin (less than 6 mils, preferably less than 4 mils and even more preferably less than 3 mils in thickness), the lead fingers can be defined to have relatively narrow widths (e.g., 5.5 mils or less) and relatively close inter-finger spacings (e.g., 2.5 mils or less) so as to accommodate integrated circuit dies which require relatively high pin counts and densities.

After die attachment, a glob made of a relatively viscous and resilient first encapsulating material is coated over and cured on the die. The first encapsulating material extends beyond the die to sealingly contact the metal die-attach pad underlying the die. Prior to curing of the first encapsulating material, the first encapsulant dam portion (central portion) of the insulative layer blocks excessive spreading of the encapsulating material. After curing, the die is sealingly surrounded about all its surfaces by the combination of the first encapsulating material and the metal die-attach pad. The combination of the cured first encapsulant and the metal die-attach pad defines a relatively flexible first protective barrier around the die for protecting the die from attack by moisture and other corrosive chemicals.

A casting frame having an annular cross section is next adhered to the top surface of the metal layer in the packaging substrate so as to surround the sides and optionally also the top of the glob covered die. Inner side walls of the casting frame are spaced apart from the first encapsulant. A continuous layer composed of a moisture-blocking epoxy (also referred to as a "backside" epoxy layer) is adhered to the bottom surface of the metal layer in opposing relation to the casting frame which is adhered to the top surface of the metal layer. The resin of a low cost molding compound (second encapsulating material) is then poured into the region surrounded by the casting frame and the backside epoxy layer to surround the top and sides of the glob covered die. The second encapsulating material is then cured. Stresses developed during curing of the second encapsulating material (molding compound) are alleviated by flexure of the resilient first encapsulating material and flexure of the flexible packaging substrate.

In accordance with a further aspect of the invention, a method and additional structure for blocking moisture from reaching the die is provided. The method comprises the already-mentioned step of: (1) attaching a moisture-blocking "backside" layer composed of a flexible moisture-blocking first epoxy to a backside surface of the packaging substrate; and the additional steps of: (2) applying a moisture-blocking "topside" ring composed of a moisture-blocking second epoxy to an opposed, topside of the flexible substrate, in the region where the ring-shaped gap (epoxy-seal gap) of the insulative layer has been defined; (3) flowing the first and second epoxies into unison through the ring-shaped gap defined in the insulative layer of the packaging substrate so that the epoxies wet and encapsulate the metal lead fingers spanning that gap; and (4) adhering a casting frame made of a metal or other moisture blocking material to the topside of the second epoxy so as to surround the die with a moisture barrier defined by the joining of the first epoxy layer to the second epoxy and the joining of the second epoxy to the casting frame. The moisture barrier is then completed around the die by adding a moisture-blocking top to the casting frame and/or by adding one or more encapsulating compounds to sealingly contact the inner walls of the casting frame and/or inner walls of the topside epoxy and to cover the die.

When the casting frame is composed of metal (e.g., anodized aluminum), it further defines an integral heat sink through which heat developed by the die may be dissipated. Preferably, the casting frame has a coefficient of thermal expansion approximately equal to (e.g., well within one order of magnitude) of the thermal expansion coefficient of the metal layer in the packaging substrate. This helps to minimize stress in the lead fingers during temperature cycling.

In accordance with yet a further aspect of the invention, closely spaced flexible metal lead fingers are defined within the metal layer of the flexible packaging substrate and these extend outwardly from points proximate to the die, through the moisture blocking seal formed by the unison of the first and second epoxies, to points beyond the periphery of the casting frame. Inner portions of the flexible lead fingers, near the die, can be defined to each have relatively fine widths and to have relatively small spacings between each other because of their thinness. As the fingers fan out and away from the die, their widths and spacings can be increased until they match line widths and spacings allowed for contact traces (or solder points) on a corresponding printed circuit board. Hot bar soldering may be used to connect the flexible outer portions of the lead fingers to solder points on the printed circuit board.

By using high resolution lithographic techniques to define the lead fingers within the relatively thin metal layer of the packaging substrate, it is possible to down scale the lead finger dimensions within the package and couple them to ICs which require relatively high pin counts and densities. The relative thinness of the packaging substrate also allows for a package which has a relatively low profile (i.e., less than 200 mils), which is small in cost and is compatible with pre-existing mounting techniques (i.e., vacuum pick and place together with hot bar soldering).

Cost is minimized because the package and method of making and using the package are based on an inexpensive and relatively thin (e.g., less than 10 mils thick) multilayer tape (packaging substrate) which is dimensioned to standard photo-industry widths (i.e., 35 mm, 48 mm, 70 mm, etc.) and sprocketed for automated handling. The tape is patterned by way of a sequence of low-cost punching and etching steps to define in its upper insulative layer: (a) a die-attach window for exposing a die-attach pad in the lower metal layer of the tape; (b) a plurality of wire-bonding windows surrounding the die-attach window for exposing wire-bondable regions of the underlying metal layer; (c) a continuous epoxy-seal gap surrounding the down-bonding windows for isolating a central portion of the insulative layer from an outer portion; (d) a plurality of outer lead windows for exposing outer lead portions of lead fingers defined in the underlying metal layer The patterning steps further define in the metal layer (a) a die-attach pad; (b) a plurality of radially extending lead fingers bridging over the epoxy seal gap; and (c) an outer shorting ring.

After the tape is patterned, portions of the metal layer which are distal from the die-attach pad are welded to a metallic, semi-rigid strip carrier having a width (e.g., 60 mm) common to semiconductor processing "magazine" carriers which were previously used for semi-rigid lead frames. The strip carrier keeps the patterned flexible tape substantially planar during subsequent processing but the central die-attach pad remains free to flex relative to the strip carrier. If tin-plating needs to be added to outer portions of the tape's thin lead fingers, the strip carrier can serve as a contact area for electroplating equipment, thus saving the thin lead fingers from direct contact and possible damage.

The semi-rigid strip-carrier is removed when the packaging process is complete, leaving behind the packaged IC with flexible (and optionally tin-plated) outer lead fingers protruding from the package body. While the strip carrier is present, however, manufacturing steps such as the attachment of an IC die onto the tape can be performed by standard automated equipment previously used for semi-rigid lead frames. The strip carrier includes alignment and indexing holes to facilitate automated handling and thus allow for maximum throughput at minimum cost per unit. Therefore, the disclosed method for packaging an IC die provides a low cost and reliable package. Other aspects of the invention will become apparent from the below detailed description.

BRIEF DESCRIPTION OF THE DRAWINGS

The invention will be described with reference to the below listed Figures.

FIG. 3A is a bottom plan view illustrating the patterned metal layer with representative variations of interdigitated leads.

FIG. 5B is a perspective view which illustrates the attachment of the tape sections to the strip carrier.

FIG. 7A is a cross sectional view showing the strip assembly clamped by vacuum to a planarizing pedestal within an automated wire bonding station.

FIG. 8 is a cross sectional view which illustrates a first encapsulating step following the wire bonding step of FIGS. 7A and 7B.

FIGS. 9A and 9B are respectively an exploded perspective view and an exploded cross sectional view illustrating a backside layer attachment step following the first encapsulating step of FIG. 8.

FIG. 12A is a cross sectional side view illustrating a second encapsulant dispensed into the strip assembly of FIG. 11 and a first fixture for biasing the flexible packaging substrate toward a planar form.

FIG. 14 is a top view of a package according to cross sections shown in any of FIGS. 13A, 13B or 13C.

DETAILED DESCRIPTION OF THE INVENTION

The following includes a detailed description of several embodiments presently contemplated by the inventors for carrying out their invention. It is to be understood that the modes described here are merely exemplary of the invention. The detailed description is not to be taken as limiting the scope of the invention.

The process of forming a package according to the invention starts with the production of a so-called "wire bondable" flexible tape (also referred to as a "TAB" tape). Such a tape is composed of a thin, flexible conductive layer and a thin, flexible insulative layer. The materials of this tape are preferably selected to withstand mechanical, thermal, chemical and electrical stresses associated with later processing, qualification testing and use. Wire bondable flexible tapes typically comprise a plurality of insulative and conductive layers joined one to the next, each layer being patterned appropriately with voids of different shapes and sizes to provide a unique combination of conductive and insulative regions. The insulative layers may be made of dielectric materials such as durable polyimide plastics known in the art, an example of which is Kapton TM (a trademark of Dupont Chemicals and available from Olin Mesa Inc., of California). Kapton TM, though known for its excellent mechanical and dielectric strengths, readily admits and conducts moisture together with other chemicals that are hazardous to IC dies. In contrast, thermoset plastics such as epoxies do not transmit moisture as readily but they tend to be less flexible and have less tensile strength than Kapton TM. The invention preferably starts with the selection of Upilex TM (trademark of UPI of Japan and available from Shindo Denshi, Japan) or a similar flexible polyimide material for the insulative layer of the wire bondable tape. Upilex TM is believed to have a lower moisture absorption and/or conduction rate than Kapton TM but its tensile strength is slightly higher and its dielectric properties are generally similar. If desired, Kapton TM can be used for the starting material instead.

Methods for packaging an IC die according to the invention will now be described in detail with reference to the Figures. For convenience, an Appendix A is included at the end of the application which summarizes a process for making a device according to the invention with cross-reference to the related Figures.

Figure 1:
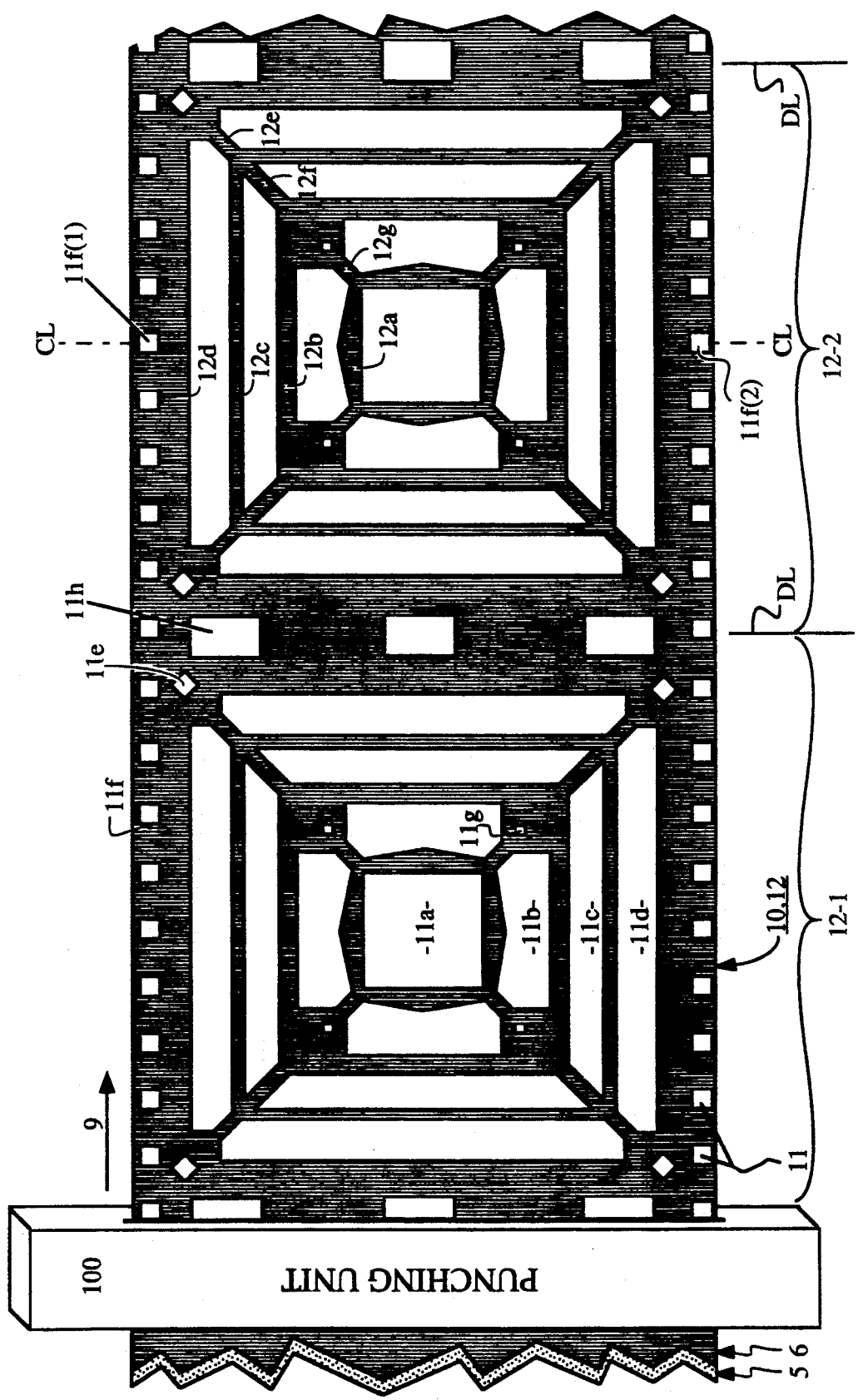
FIG. 1 is a top plan view of patterned dielectric tape according to the invention.

Referring to FIG. 1, a 3 mil thick sheet of Upilex TM, 6, is provided in a standard width such as 35 mm, 48 mm or 70 mm wide. If Kapton TM is selected as a substitute, the thickness should be increased to approximately 5 mils. More mechanical strength is provided as the sheet 6 is made thicker but thicker sheets are less flexible and cost more. There is a tradeoff between strength, flexibility and cost. The width of the sheet is selected primarily to match the widths of photographic film processing equipment and to later provide for a desired package footprint, pin count and pin density. In one embodiment of the invention, a 35 mm tape was used to provide a JEDEC MO-102 quad-flatpack configuration having at least a 100 to 200 pin count. In another embodiment, a 48 mm tape was used to provide a flat-pack having at least 164 to 300 pin count capability. For higher pin counts (e.g., 300-444), a 70 mm wide tape is preferably used. These dimensions and pin counts are dictated primarily by the minimum trace pitch and spacings that are allowed or required on the printed circuit board (PCB) to which the packaged device is later mounted. The allowed outer dimensions (i.e., footprint) of the package body are additional factors which control pin count and pin density. The invention is not limited to any specific pin count or dimension recited above. Pin count capability can increase as the wire density of a corresponding PCB processing technology increases or as the allowed package footprint area increases.

Referring still to FIG. 1, the uniform sheet 6 of Upilex TM or other insulative film (e.g., Kapton TM or another similar plastic) which has a standard width (35 mm, 48 mm, 70 mm, etc.) and a workable thickness (e.g., 2 to 5 mils) is uniformally coated on its bottom surface with an adhesive layer 5 having a smaller thickness of approximately 0.8 mil. For devices which are to operate at temperatures as high as 150° C., the adhesive layer 5 is preferably composed of a B-stageable butylphenolic epoxy having a relatively higher glass transition temperature, $T_g$, of 160° C. or higher.

The joined Combination, 5/6, of the insulative film 6 and the adhesive film 5 is fed in direction 9 through a mass production punching unit 100. Punching unit 100 cuts a plurality of holes 11 through the combination sheet 5/6 to thereby produce a repetitively patterned first tape 10/12 composed of adhesive layer 10 and an overlying insulative layer 12 as shown. Voids defined through the adhesive layer 10 and insulative layer 12 will be referred to as apertures 11a, 11b, 11c, etc., while remaining parts of the original insulative film 6 will be referred to as insulator segments 12a, 12b, 12c, etc. Corresponding segments 10a, 10b, 10c, etc. (not seen in the Figure) of the adhesive layer 10 are understood to be attached to the insulative layer 12.

As shown in the top plan view of FIG. 1, a first, substantially square aperture 11a is defined centrally in each periodically repeated section 12-1, 12-2, etc. of the first patterned tape 10/12. This central aperture is also referred to as a "die-attach window" 11a because it is later used to expose a metal area to which a die is attached. Surrounding the die-attach window 11a is a first continuous ring 12a of insulator material which is also referred to here as a "first encapsulant dam" 12a. The outer periphery of the first encapsulant dam 12a has an octagonal shape from which metal lead fingers will later radiate outwardly while the inner periphery has a square shape whose inner walls are later used to impede the outward flow of a gel-like first encapsulating material.

Four secondary apertures 11b of generally rectangular shape surround the first encapsulant dam 12a in alignment with its square inner periphery as shown. These secondary apertures are also referred to as "wire-bonding windows" 11b because they will later expose wire-bondable portions of radially extending lead fingers (not yet shown). Surrounding the wire-bonding windows 11b is a second continuous ring 12b of insulator material having a generally square-shaped outer outline.

Four trapezoidally shaped, tertiary apertures 11c are defined respectively along the outer sides of the square-shaped second ring 12b. These tertiary apertures 11c are also referred to as "epoxy-seal windows" 11c because they later define major portions of a yet-to-be-defined annular epoxy-seal gap (11jc of FIG. 4). Surrounding the epoxy-seal windows 11c is yet a third square-shaped ring 12c of insulator material.

Four generally trapezoidal apertures 11d are defined along the outer sides of the third ring 12c of insulator material. These latter apertures are also referred to as "outer-leads windows" 11d because the outer portions of not-yet-defined lead fingers are exposed through these apertures. Finally, a fourth, generally square-shaped outer ring 12d of insulator material concentrically surrounds the first three rings 12a, 12b, 12c and aperture series 11a to 11d.

As further shown, four diagonally extending segments 12e of the insulator material respectively link the four inner corners of outer ring 12d to corresponding outer corners of the third ring 12c. Diagonally extending segments 12f link the inner corners of the third ring 12c to the outer corners of second ring 12b. And diagonally extending segments 12g link the inner corners of the second ring 12b to the outer corners of inner ring 12a. Links 12e and 12f are sacrificial and will be later removed.

Also defined in the patterned insulator layer 12 are a plurality of gross and fine alignment holes, 11e and 11g respectively, which later expose metal patterns (not yet formed) used for accurately positioning individual sections 12-1, 12-2, etc. of the patterned insulator layer 12.

Two continuous series of square-shaped sprocket holes 11f are respectively defined at the opposed edges of the patterned insulator layer 12 to facilitate automated handling of the resulting tape. The sprocket holes 11f preferably conform to a so-called "super-8" format used in the photographic film industry. This format is believed to maximize the available area between the edges of the tape 12 for other use. At least two opposed sprocket holes, 11f(1) and 11f(2), are aligned with a major center line CL of apertures 11a through 11d. Those holes, 11f(1) and 11f(2), function not only as sprocket holes but also as alignment holes for aligning their respective tape section (e.g., 12-2) to a soon-to-be described strip carrier (500 of FIG. 5A).

Figure 5A:
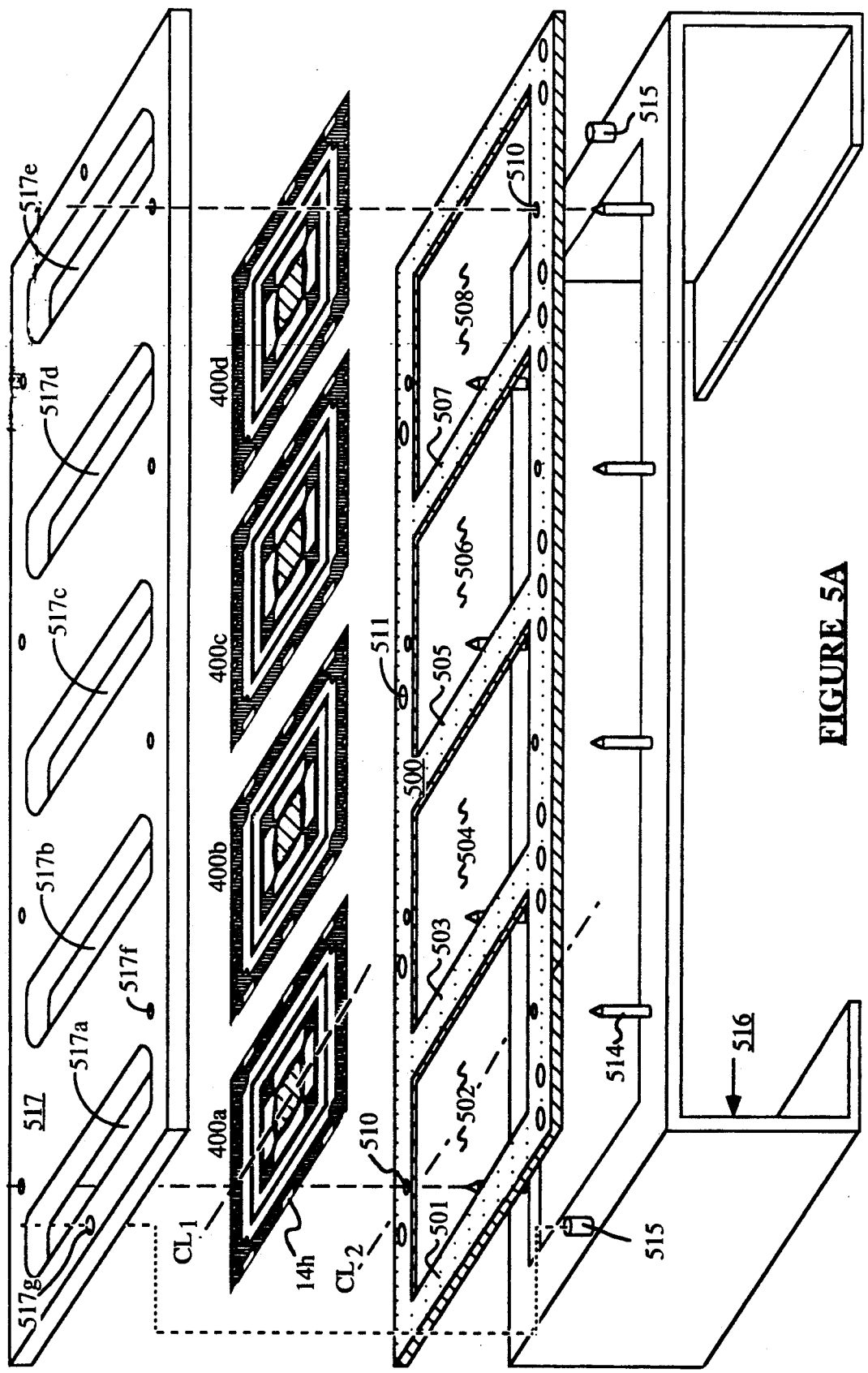
FIG. 5A is a perspective view illustrating four individual sections cut from a continuous strip of the wire bondable tape and a strip carrier aligned to receive the four sections.

Three rectangularly shaped holes 11h are defined along the dividing line, DL, which separates each of the repeated section 12-1, 12-2, etc. of the tape 12. These holes are also referred to as "weld-through windows" 11h because they later expose a top one of two overlapping layers of metal, thus allowing the metal layers (14* of FIG. 3C and 500 of FIG. 5A) to be welded together with spot welding equipment (as shown in FIG. 5B).

Figure 2:
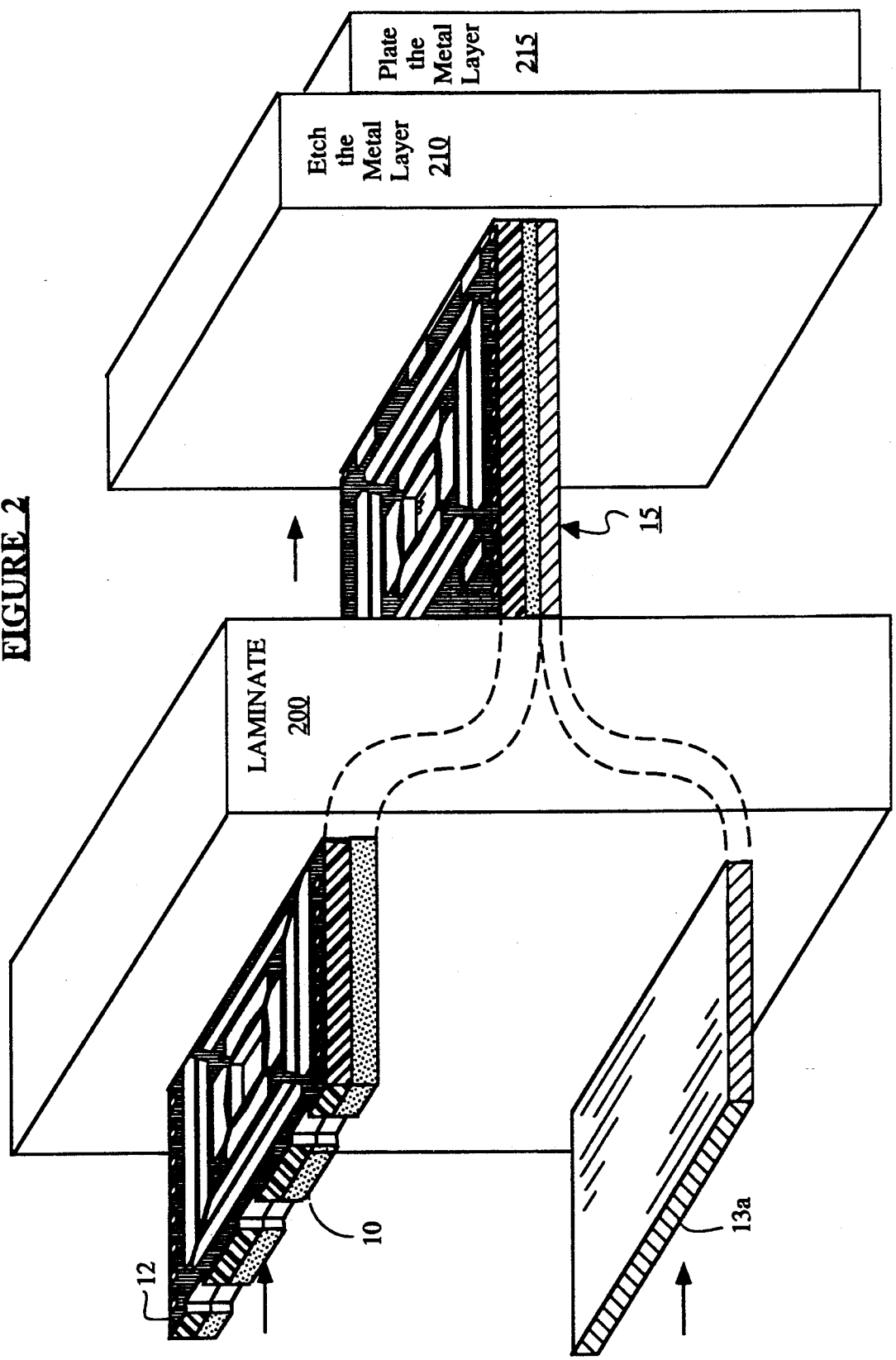
FIG. 2 is a perspective view showing formation of a three-layer flexible substrate according to the invention.

Referring to the perspective view of FIG. 2, it is seen that the patterned insulator layer 12 is next laminated by way of the like-patterned adhesive layer 10 to a continuous metal layer 13a of approximately the same width (e g., 35, 48, or 70 mm). The metal layer 13a is relatively flexible. It has a uniform thickness of less than 4 mils, preferably less than 3 mils and typically in the range 1.4 mils plus or minus 50%. It is made of copper or another suitable conductive metal. The laminating adhesive 10 is selected to cure at a temperature well above 150° C. (e.g., 200° C.) and to hold the upper insulator layer 12 strongly to the lower metal layer 13a at least to a predetermined maximum processing temperature of for example, 150° C.

The resulting sandwich 15 of top insulative layer 12, intermediate adhesive layer 10 and bottom metal layer 13a, which sandwich is shown in FIG. 2 emerging from laminate step 200, is generically referred to in the industry (without the apertures pattern 11 of FIG. 1) as a "three layer tape". Three layer tape 15 is relatively flexible and needs to be held on a planarizing surface or by a planarizing frame in order to obtain a planar form. It will be later seen that the present invention utilizes a semi-rigid strip carrier (500 of FIG. 5A) to bias the tape into a substantially planar form, but that the tape 15 retains its ability to flex out of its normal plane.

A more flexible "two layer tape" (not illustrated) is also known in the art. Such a two layer tape is typically formed by sputtering and/or electro-depositing one or more metal layers directly onto a base insulator layer. Two-layer tapes are available from manufacturers such as 3M Electronic Products Division of Austin, Tex. Three-layer tapes may be obtained from tape manufacturers, such as Olin Mesa of California and Shindo Denshi of Japan. Either one of the two-layer and three-layer configurations may be used for the present invention, but the three-layer configuration is preferred because it is generally less expensive to manufacture, it has less of a tendency to "wrinkle" and thus it is slightly easier to hold it planar.

After the laminated tape structure 15 is produced at step 200 of FIG. 2, the resulting tape 15 is fed into a metal etching apparatus 210 in order to define a pattern of lead fingers and other features in the metal layer 13a as will be seen shortly in FIG. 3A. The bottom metal layer 13a is patterned lithographically in the etching apparatus 210 to remove unwanted portions thereof and the remaining metal (now referred to as patterned metal layer 14) is plated at step 215 with gold or another noble metal to produce a patterned and plated metal layer 14*. Gold bond wires can now be thermosonically bonded to the plated metal surfaces 14* of the tape and thus the tape is referred to as a "wire bondable tape".

Before discussing FIG. 3A, it should be explained that there are a variety of techniques different from those described thus far for patterning an insulative layer (12) and a conductive layer (13a) in order to form a wire bondable tape according to the invention. By way of example, the voids 11 of insulator layer 12 may be formed using an etching process in place of the punching process (100). The punching process (100) is preferred over the etch process for defining relatively crude features because the punching process is easily adapted to high-speed mass production and is therefore cheaper. However, the dimensions allowed for apertures 11a, 11b, 11c, etc. and insulator segments 12a, 12b, 12c, etc. tend to be larger when punching is used instead of etching. It is within the contemplation of the invention to etch the insulator layer when features of finer dimension are desired.

For the metal layer 13a, an etching process (210) is preferred because etching can easily provide the finer line widths and spacings called for by high density IC designs. It is to be understood that other methods for patterning the metal layer, including punching and/or electro-deposition, are within the contemplation of the invention.

The above-described plastic punch and metal etch processes are commonly used (without any specific patterning) by TAB tape manufacturers such as Olin Mesa of California and Shindo Denshi of Japan. A wire bondable tape in accordance with the invention may be obtained from these manufacturers by providing them with the disclosed insulator and metal patterns of FIGS. 1 and 3A respectively. Typically, 5 mil thick Kapton or more preferably, 3 mil thick Upilex is requested for the base insulator layer 12. A metal content in the range of one ounce to two ounces of copper per square foot may be specified for the metal layer 13a depending on the copper thickness desired. For 1 oz. Copper, the thickness of layer 13a is typically 1.4 mil. When 2 oz. Copper per square foot is specified, the resulting thickness is approximately 2.8 mil.

FIG. 3A is a bottom plan view which illustrates the metal features 14 of one section, 16-1, in a repetitively patterned three-layer tape 16 produced by the etching process 210 of FIG. 2. The illustrated metal features of each tape section 16-1 are defined with available lithographic techniques. Each tape section 16-1 has near a central portion (14a) of its now patterned metal layer 14, a first relatively small pitch, P1, of for example, approximately 10 mils or less between metal features (e.g., 6 mil wide lead fingers separated by 4 mil wide spaces). Moving from the central portion (14a) to an outer portion (14d) of the section 16-1 the dimensions of the patterned metal 14 can fan out to a relatively larger outer pitch, P2, ranging from, for example, 10 mils to 20 mils or more. An intermediate test fixture pitch, P3, of 15 mils is optionally provided at the outer edges of the section 16-1. The selected dimensions of the metal layer features depend on a variety of factors including the number and density of contact pads on a next-to-be added IC die, the probing limitations of a later-used electrical test fixture, and the trace width/spacing limitations of a printed circuit board to which the completed package will be mounted.

As seen in FIG. 3A, the patterned metal layer 14 (which is formed from layer 13a) has a flexible die-attach pad 14a provided centrally within the tape section 16-1 for supporting a semiconductor die (not yet shown). Central pad 14a covers the die-attach window 11a and is anchored by non-removed parts of the adhesive layer 10 (not seen) to the inner periphery of the bottom surface of the first encapsulant dam 12a. Extending radially away from the central pad 14a are a plurality of thin, flexible lead fingers 14b, which are spaced apart from central pad 14a by a gap distance 14g but are supported by and attached to the bottom of the first encapsulant dam 12a at their inner ends by adhesive layer 10. From the first encapsulant dam 12a, the lead fingers 14b span across the wire-bonding windows 11b, as shown, and anchor to the second ring 12b of insulator material. From there, the lead fingers 14b continue across the epoxy-seal windows 11c, anchor to the third ring 12c, span across the outer-lead windows 11d, and then anchor to the fourth, outer ring 12d where they join continuously with and electrically connect to an outer shorting ring 14d. Shorting ring 14d is a square shaped continuous ring of metal which is anchored by adhesive 10 (not seen) to the bottom side of the outer ring 12d of insulator material, as shown. A relatively wider contact pad 14c is preferably defined at the outer end of each lead finger 14b for electrical testing. Contact pad 14c is positioned over the outer insulator ring 12d, before the lead finger joins integrally with the shorting ring 14d.

An exception to the above lead finger description is an optionally provided, backside-biasing finger 14bb which is not separated from the die-attach pad 14a by a gap 14g, but rather spans across windows 11d, 11c, 11b and merges continuously into the die attach pad 14a to thereby provide an electrical path from central pad 14a to at least one outer-leads window 11d. The backside-biasing finger 14bb is included when a specific pin number of the package has been pre-designated as a backside connection. Otherwise, a down-bonding or jumper wire is used to programmably form the backside connection as will be seen later (FIG. 7A) when a wire bonding step is described.

Only a small number of lead fingers are shown in FIG. 3A in order to avoid clutter and confusion. It is to be understood that many more lead fingers are contemplated. In one 70 mm wide embodiment of the invention, as many as 111–131 leads 14b are located on each side of the die-attach pad 14a and the total of 444–524 lead fingers are each dimensioned as small as 5 to 5.5 mils wide or less with 2.5 mil spacing or less between adjacent edges, thereby achieving a pitch of 7.5 to 8.0 mils or less. Much smaller dimensions can be achieved depending on the bonding equipment and thickness of the metal layer 13a and on the lithographic process used by the tape manufacturers.

Metal pattern 14 further comprises four electroplate interconnecting leads 14e which extend radially from the four corners of the die-attach pad 14a to corresponding corners of the outer shorting ring 14d. The electroplate interconnect leads 14e are anchored (by adhesive 10, not shown) to the corner linking segments 12e, 12f, and 12g of the insulator layer 12. These interconnecting leads 14e provide electrical continuity between the die-attach pad 14a and the outer shorting ring 14d to facilitate a next described step (215) where the patterned metal 14 is plated with a surface layer (13c) made of gold or another noble metal (e.g., spot plating with silver).

At an inner location on the metal pattern 14, overlying the small alignment apertures 11g of the insulator layer 12, the electroplate interconnecting leads 14e are widened and three of them are patterned with pin-wheel ("X") shaped apertures 14f while one other is patterned to have a circular aperture 14q. These apertures, 14f and 14q, become visible from the topside of the tape through the fine alignment openings 11g of the insulative layer 12. The pin-wheel apertures 14f are used by alignment and pattern recognition steps described later to accurately position the tape section 16-1.

Near their outer ends, the electroplate interconnecting leads 14e are again widened and overlapped across alignment apertures 11e of the insulator layer 12. Two diagonally opposed electroplate interconnecting leads 14e are patterned with a first shaped cutout 14j which is smaller in size and/or different in shape (e.g., circular instead of rectangular) than the gross-alignment openings 11e of the insulator layer 12. Two other diagonally opposed interconnecting leads 14e are patterned with a second shaped cutout 14k, which can be the same shape as and slightly smaller than the insulator openings 11e or different therefrom, but which is different from the first shaped cutouts 14j. These cutouts in the metal layer, 14k and 14j, are later respectively used for gross and fine mechanical alignment.

Figure 3B:
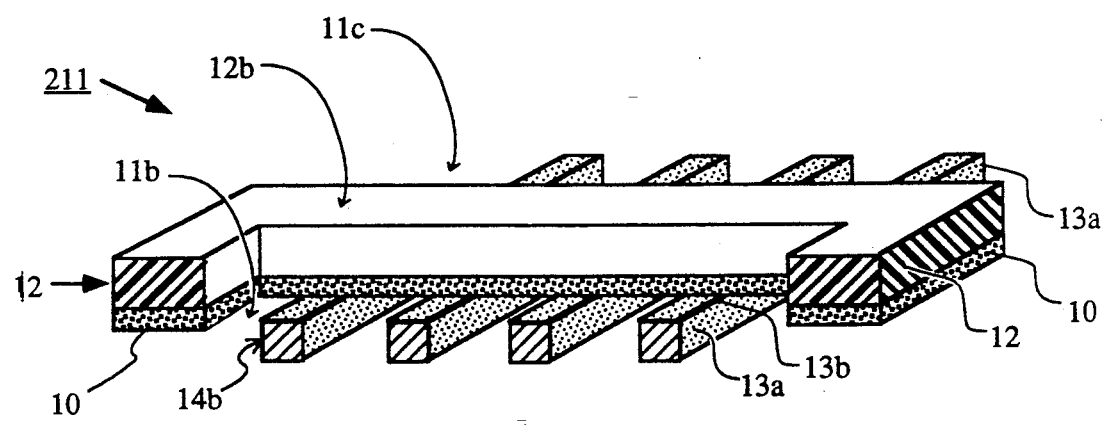
FIGS. 3B and 3C are perspective sectional views taken along line BB—BB of FIG. 3A to illustrate the laminated tape structure before and after plating with a noble metal.
Figure 3C:
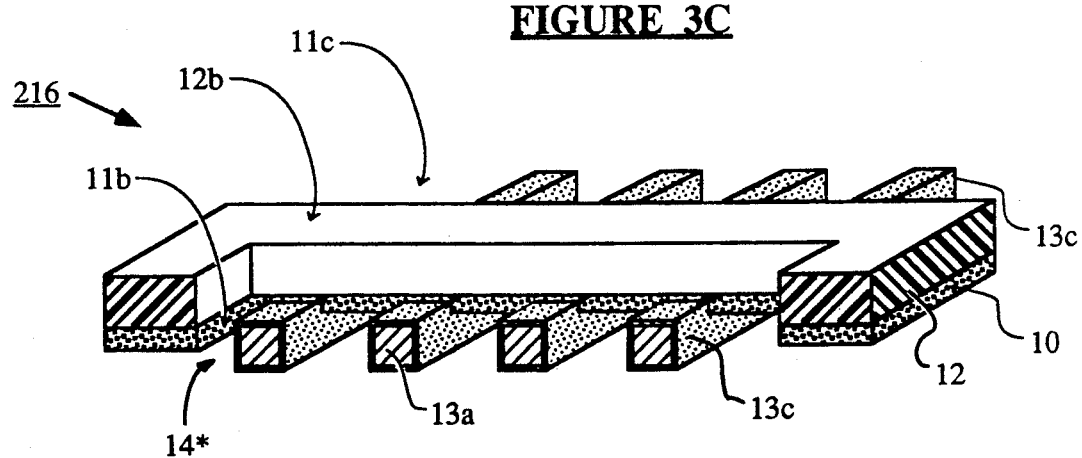
Figure 4:
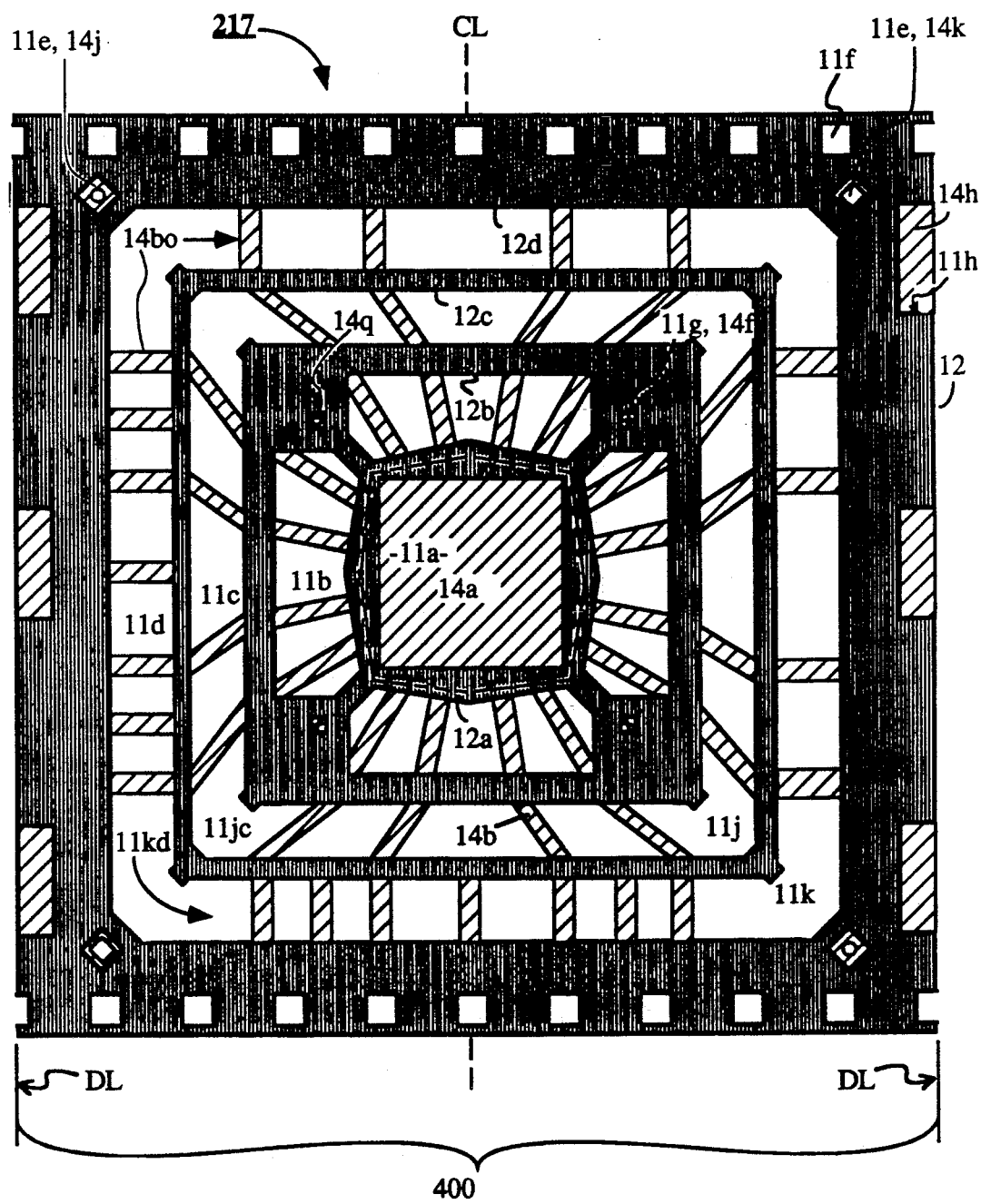
FIG. 4 is a top plan view of a patterned wire bondable tape according to the invention after sacrificial corners are removed.

Referring momentarily to FIG. 4, which is a top plan view of one corresponding section 400 of a wire bondable tape 217 formed after a next described plating step 215 is performed (explained by FIGS. 3B and 3C), it can be seen that the pattern of each section 400 appears generally symmetrical except for the top left and bottom right alignment apertures 11e which are distinguished from their top right and bottom left counterparts by the first shaped cutouts 14j. As a result of this distinguishable landmark on the wire bondable tape section 400, the section 400 can be automatically positioned on a fixture having corresponding alignment pins in a unique, predefined orientation, thus enabling high-volume, low-cost automated processing. The finer pinwheel shaped alignment apertures (14f) and circular aperture 14q of the wire bondable tape section 400 can be scanned, through openings 11g recognized and used by an optical pattern recognition/alignment means available in automatic processing equipment or by the operators of manual processing and inspection equipment to properly position each tape section.

As further shown in FIG. 4, the patterned metal layer 14 comprises welding pads 14h which are exposed from the topside of the tape section 400 through the "weld-through" apertures 11h of the insulator layer 12. More will be said about these later on. Returning to the bottom plan view of FIG. 3A, it can be seen that the welding pads 14h are integral parts of the outer shorting ring 14d.

As further seen in FIG. 3A, the patterned metal layer 14 may further comprise a plurality of test-probe leads 14p which are anchored to the outer insulator ring 12d and interdigitated with outer ends 14bo of the lead fingers 14b. The test probe leads 14p extend from the shorting ring 14d radially towards the die-attach pad 14a but stop at outer leads windows 11d. These probe leads 14p can be used for a variety of purposes including mating with probe pins on a later-used test fixture. Preferably, the probe leads 14p have relatively wider probe pads 14n located at a predetermined position along their lengths. The positions and numbers of these probe pads may vary depending on a customer's requirements.

In some embodiments, so-called "no connection" (N.C.) outer leads 14o span across the outer-leads windows 11d, as shown in FIG. 3A, but terminate before extending across the epoxy seal windows 11c. These N.C. leads 14o are used when the package design calls for more pins than are actually needed by the packaged IC die. Only the actively used lead fingers 14b should extend through the epoxy seal windows 11c. This reduces the risk of moisture leakage through areas of a later-formed "epoxy seal" that are pierced by the lead fingers 14b. The epoxy seal is later formed by moisture resistant materials deposited in the region of the epoxy seal windows 11c.

Once the features of metal layer 14 are defined, their exposed surfaces are covered either entirely or spotted with a plating metal. FIG. 3B shows a perspective top view of a cross-section BB—BB taken out of FIG. 3A. The perspective sectional view of FIG. 3B shows a portion of a wire-bonding window 11b and a number of lead fingers 14b exposed through the wire-bonding window 11b. The lead fingers are seen to run under the second ring 12b of the insulator layer 12 and are again exposed at the other side by the epoxy-seal window 11c. The lead fingers 14b are, of course, defined from the original metal layer 13a and they are joined to the insulator layer 12 by non-removed portions of adhesive layer 10. All metal surfaces of the patterned metal layer 14 are electrically continuous, and thus, when the metal layer 14 is immersed in an electroplating bath without a spotting mask, and an electroplating voltage is applied to the outer shorting ring 14d, all exposed surfaces become plated. When a spotting mask is used, at least the metal in the bonding windows 11b should be left exposed for plating. The cross-sectional portion shown in FIG. 3B is referenced as section 211, indicating that it is the output product of metal etching step 210 in FIG. 2.

In FIG. 3C, the resulting section after the metal plating step 215, is referenced as plated tape 216. It can be seen in FIG. 3C that the metal pattern 14* (e.g., gold covered copper) is now plated on all exposed surfaces with a second, plating metal 13c. The plating metal 13c is preferably gold or another noble metal and it is deposited to a suitable thickness of, for example, approximately 30 micro inches to thereby create a wire bondable tape 216 as the product of step 215. An alternative is to spot plate only the die attach-pad 14a and wire-bondable portions of the lead fingers (exposed by windows 11b) with silver. The plating thickness according to the present invention is preferably in the range 30 micro inches to 60 micro inches. The thicker the plating, the longer it takes for atoms of the original metal layer 13a (copper) to diffuse out in substantial quantities through the plating metal 13c (gold) over time. Out diffusion of metals such as copper is undesirable because it can interfere with a later, thermosonically based, wire bonding step. The out diffusion typically takes place while the plated tape 216 is held in storage for long periods of time (e.g., months). Use of a thicker gold or silver plating 13c provides a longer shelf life to the plated tape, but is more costly because of the additional gold or silver. Often, the wire bondable tape 216 will be spooled onto a tape reel (not shown) and stored as such in a dry atmosphere (to remove moisture from the tape) until the tape is immediately needed for the packaging a prespecified IC die.

Figure 3D:
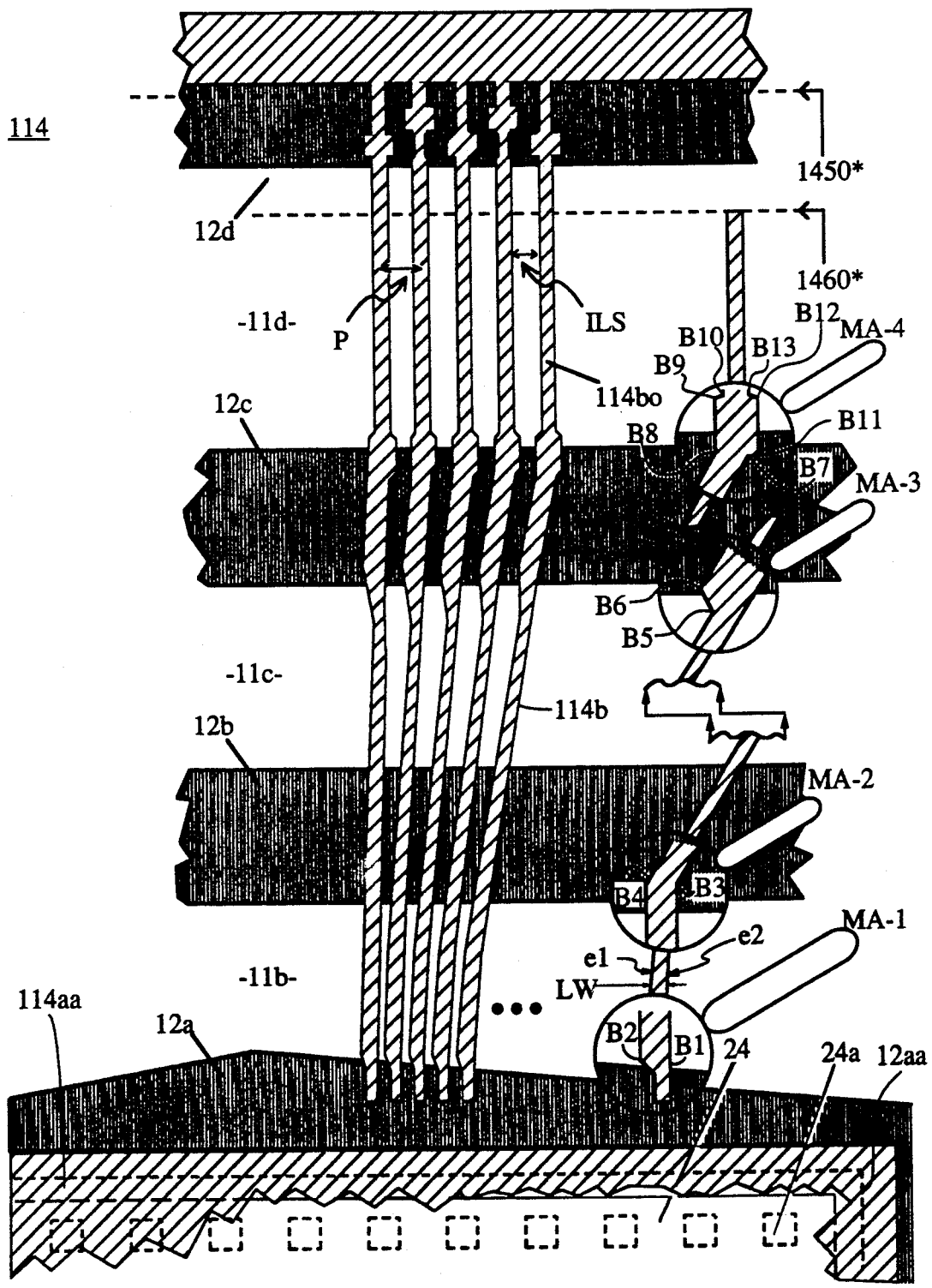
FIG. 3D is a bottom plan view of a further metal pattern according to the invention.

Referring to FIG. 3D, a bottom plan view of another pattern 114 for the metal layer is shown. In this FIGURE, hidden lines show a die 24 having bonding pads 24a which is already attached (according to a later described attachment step) to the opposed (top) side of the die attach pad 14a. Hidden line 12aa represents the inner boundary of the first encapsulant dam 12a. Region 114aa which is located at the top side of the die-attach pad between the die 24 and inner dam boundary 12aa represents an exposed annular pad area surrounding the die. Lead fingers 114b are angled and tapered as shown to provide a first-desired metal pitch (P) and inter-lead spacing (ILS) at a wire-bonding area 11b proximate to the die 24, to provide a second wider pitch and/or inter-lead spacing in the area of the epoxy-seal window 11c and to provide a third even wider pitch and/or inter-lead spacing at the outer insulator ring 12d. Lines 1450* and 1460* identify the placement of a package excision cuts later described with reference to FIG. 14.

A number of mechanisms need to be considered in the design of the lead fingers 114b as shown in FIG. 3D. In the wire-bonding windows 11b the lead width (LW) needs to be 5.5 mils in order to comply with requirements of currently-available automatic wire-bonding equipment. The inter-lead spacing (ILS) is minimized to 2.5 mils as allowed by currently available lithographic techniques. These LW and ILS dimensions can be reduced, of course, when so allowed by advancements in wire bonding techniques.

In the area where inner ends of the lead fingers 114b anchor to the bottom of the first encapsulant dam 12a by way of adhesive 10, it is desirable to maximize the contact area for strong adhesion but to also maximize inter-lead spacing (ILS) in order to avoid electrical shorts induced by migration of metal from the lead fingers over the surface of the insulator ring 12a. The pitch is set at 8 mils here because of the LW=5.5 and ILS=2.5 dimensions called for in bonding area 11b. A compromise is struck between adhesion surface area and ILS by using a one to one ratio between lead width and inter-lead spacing, that is, LW=4 mils and ILS=4 mils in the area where the lead fingers anchor to the first encapsulant dam 12a. The inner ends of the lead fingers 114b preferably extend at least 15 mils over the surface of the inner dam 12a to strongly anchor the lead fingers to the inner dam 12a. The inner end anchorage area is thus approximately 60 square miles and the lead width to length aspect ratio in the anchorage area is 1 to n (1:n) where n is a number greater than one (e.g. n=3). In situations where it is possible to increase the lead finger pitch above 8 mils, it is preferable to first increase the inter-lead spacing (ILS) to a dimension slightly larger than the thickness of the insulator layer 12 (i.e., to a spacing of approximately 6 mils as compared to the 3-5 mil thickness of layer 12) before starting to increase the lead width (LW) above 4 mils.

It was found that a maximum stress point develops where the left and right edges, $e_2$ and $e_1$, of each lead finger 114b cross over the outer edge of the first dam 12a into the wire-bonding window 11b. Stress increases further if there is a break, $B_x$, in the linearity of a lead finger edge $e_x$ while it crosses over. Accordingly, breaks in the linearity of each lead finger edge (e.g., $B_1$ and $B_2$ of magnified area MA-1) are preferably defined at least a small distance (e.g., 0.5 mil to 2.5 mils or even as much as 5.0 mils where space allows) away from the crossover point to reduce stress. Where possible, break points in the linearity are provided only where the lead fingers 114b are reinforced by an underlying strip of insulator layer such as occurs at break points $B_3$ and $B_4$ in magnified area MA-2 of the second insulator ring 12b. The lead fingers 14b are radiated out at steeper and steeper angles as one moves from the center of the die to its corners. Portions of the steeply-angled lead finger shown at the right side of FIG. 3D are visually "shifted" back to the left as indicated by wavy break lines in order to show the entirety of the lead finger (up to cut line 1460*) in the one figure.

As the lead fingers 114b fan out from second ring 12b to third insulator ring 12c, the inter-lead spacing (ILS) increases gradually to 6 mils due to radial angling of the lead edges, $e_1$ and $e_2$, after breakpoints $B_3$ and $B_4$. Starting at breakpoint $B_5$, the ILS is then held constant at 6 mils while the lead width (LW) variably expands as indicated at break points $B_5$ and $B_6$ of magnified area MA-3 to fill the remainder of available area. It is desirable to maximize the anchoring area of the lead fingers 114b as they pass over the third insulator ring 12c since the further out portions of the lead fingers in outer window 11d may be stressed during later lead bending and board mounting steps. This maximized anchoring area (as depicted to be continued until breaks $B_7$, $B_8$ and $B_{11}$ and slightly thereafter in magnified area MA-4) reinforces the lead fingers 114b so that they can later withstand a shearing force applied at second cut line 1460*.

As the lead fingers pass through the epoxy-seal window 11c, it is desirable to maximize the inter-lead spacing (ILS) and minimize the lead width (LW) in order to avoid moisture leakage and electrical crosstalk. The minimum dimension for the lead width (LW) is currently 4 mils. This dimension allows for a 1 mil defect tolerance while still providing a necessary level of mechanical strength and electrical conductivity in each lead finger.

Just before the lead fingers extend beyond third ring 12c, the radial angling of the fingers ceases at breakpoints $B_7$ and $B_8$, the fingers are widened at breakpoint $B_{11}$ to cross the outer edge of third ring 12c orthogonally and thereafter they are tapered slightly by breakpoints $B_9$, $B_{10}$, $B_{12}$, $B_{13}$ before continuing across outer leads window 11d. As the lead fingers 114b extend over the remainder of outer-leads window 11d, the lead width (LW) is set to approximately two fifths (2/5) of the total pitch (P) while the inter-lead spacing (ILS) is set to approximately three fifths (3/5) of the pitch (P). The ILS in outer-leads window 11d is preferably 6 mils or greater, as permitted by the trace pitch of a printed circuit board to which the package will be mounted.

During manufacture of the lead package, a first singulating cut is made according to line 1450*, removing the outer shorting ring of metal 14d but leaving a portion of outer insulator ring 12d and test contact areas 114c attached to the remainder of the lead fingers 114b. After electrical testing, a second (lead-trimming) cut is made along line 1460* to remove the test contact areas 114c. During this second cutting operation (1460*) the remaining outer ends 114bo of the lead fingers 114b are simultaneously "formed" or bent in a lazy "S" shape by approximately 45° to 80° below the plane of FIG. 3D and then back parallel to the package bottom to allow for an immediately following board-mounting step where the terminal ends of the lead fingers are held in place by a "hot bar" and soldered to traces on a target printed circuit board. The lead fingers 114b are generally flexible such that even a minute force of less than 10 grams per lead finger will be capable of causing them to bend, however, they preferably have enough rigidity to sustain their own weight in a bent form. The step of hot bar soldering anchors the ends of the S-shaped outer leads to the printed circuit board and thereby allows them to support the weight of the IC package.

Following the metal patterning step 210 and noble-metal plating step 215 (FIG. 2), the wire bondable tape 216 is passed through a corner-trimming fixture (not shown) and, as next shown by the top plan view of FIG. 4, in each contiguous section 400 of the plated tape 216, the sacrificial corner segments 12e and 12f are now punched out, leaving gaps, 11j and 11k. The resulting (corner-trimmed) tape is now referred to as a "floating ring" tape 217.

The combination of gaps 11j and epoxy-seal windows 11c in the corner-trimmed tape 217 now defines a continuous ring-shaped gap 11jc between second insulator ring 12b and third insulator ring 12c. Although the base insulator layer 12 may be made of a moisture conducting material such as Kapton ™ or Upilex ™, moisture cannot move directly through the layer 12 material from third ring 12c to second ring 12b, because of the interposed and continuous gap, 11jc.

The combination of gaps 11k and outer-leads windows 11d defines another annular gap 11kd which completely separates the third insulator ring 12c from the fourth insulator ring 12d. The tape structure confined within the borders of the second insulator ring 12b is now flexibly joined to the outer insulator ring 12d only by the radially extending lead fingers 14b. Because the lead fingers 14b are thin (e.g., 1.4 mils) and flexible, the die-attach pad 14a can move slightly (e.g., a displacement of approximately 10-20 mils) in a direction orthogonal to the surface of FIG. 4 even when the outer insulator ring 12d is fixed in position at the points of its weld-through windows 11h.

Referring next to the perspective view of FIG. 5A, individual sections 400a, 400b, 400c and 400d are created by next cutting a continuous strip of the flexible tape 217 from edge to edge along the dividing line DL which passes centrally through the weld-through apertures 11h, using a strip cutting machine (not shown). The sprocket holes 11f are used for aligning the cutting knife over each dividing line, DL, of the tape 217.

Figure 5C:
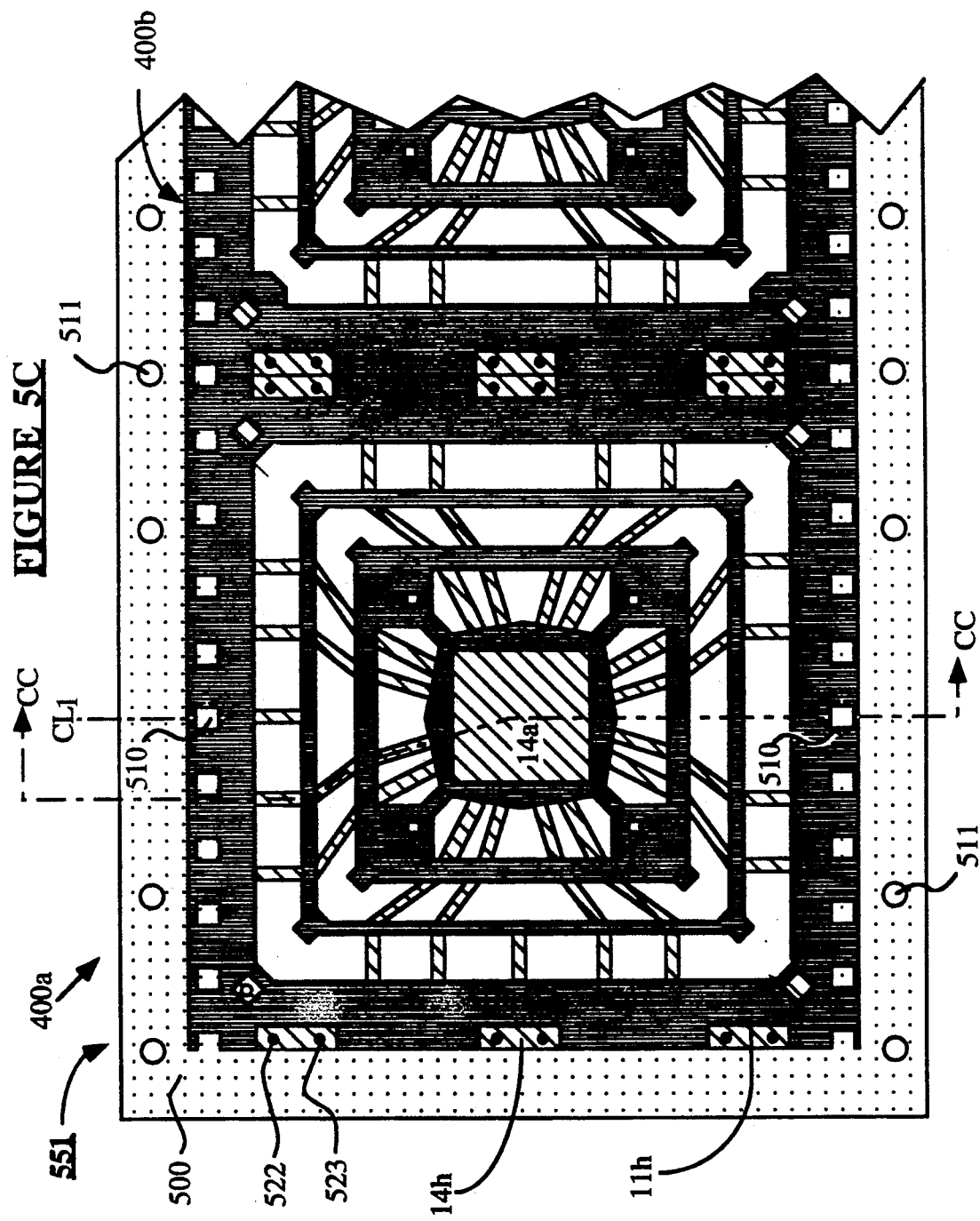
FIG. 5C is a top plan view of the welded assembly shown in FIG. 5B.

A strip carrier 500 made of a semi-rigid conductive material is positioned below the now-separate tape sections 400a-400d as shown. The strip carrier 500 is typically made of copper or a copper alloy and has a thickness of approximately 6 mils to 15 mils (preferably 12 mils). This thickness, it should be noted, is approximately the same as that of semi-rigid lead frames previously used in the industry. The width of the strip carrier 500 (typically 60-millimeters when a 48 mm TAB tape is used) is wider than that of the wire bondable tape 217 and is selected to correspond with the width of "rails" provided in transport magazines (not shown) that are commonly used in industry for transporting semi-rigid lead frame structures from one automated-feed machine to the next. The length of the strip carrier 500 is set to conform to a predetermined length of such magazines, and as shown in FIG. 5C, to support a predetermined number (e.g., 4) of tape sections 400, one placed adjacent to the next.

A plurality of welding strips, 501, 503, 505, 507 and 509, are integrally defined on the strip carrier 500 and these welding strips 501-509 are spaced apart from one another by a plurality of respectively interposed strip windows 502, 504, 506 and 508. The strip windows 502-508 are dimensioned slightly smaller than corresponding tape sections 400a-400d so that peripheral portions of the latter tape sections 400a-400d, including their welding pads 14h, may be respectively supported by the borders of the strip windows 502-508.

In correspondence to the center line CL$_1$ of each tape section 400a-400d, a pair of first alignment holes 510 are provided in the strip carrier 500 at opposed ends of a second center line CL$_2$ passing centrally through each strip window (i.e., 502). The center line CL$_1$ of each overlying tape section (i.e., 400a) is aligned parallel to the center line CL$_2$ of the strip carrier window (i.e., 502) using a pair of spaced-apart alignment pins 514 provided on an alignment jig 516. The first alignment holes 510 of the strip carrier are slipped over corresponding alignment pins 514 of the alignment jig, and then the central sprocket holes 11f(1), 11f(2) of the corresponding tape section (i.e., 400a), are also slipped onto the same pins 514 to thereby align the tape section (i.e., 400a) with a corresponding strip window (i.e., 502).

Next, a relatively heavy and substantially flat cover plate 517 (aluminum) having five weld-through windows 517a to 517e and four interposed pairs of alignment pin holes 517f defined therethrough is placed on top of and aligned (using pins 514 and holes 517f) to the tape sections 400a-400d to thereby flatten and hold the tape sections against the borders of strip windows 502-508. Larger jig posts 515 and larger top plate holes 517g cooperate to align the cover plate 517 grossly to the jig 516 before smaller alignment pins 514 mate with smaller pin holes 517f.

As next seen in the perspective sectional view of FIG. 5B, a spot welding tool 519 is used to bond (welding step 518) the welding pads 14h of each tape section 400a-400d to the corresponding and underlying welding strips 501-509 of the strip carrier 500. A top electrode (519a) of the spot welding tool contacts the welding pads 14h through weld-through windows 517a-517e of the cover plate and through the weld-through apertures 11h earlier formed in the insulator layer 12. An opposed bottom electrode (519b) of the spot welding tool contacts an opposed bottom surface of the corresponding welding strip 501-509. Current passes between the electrodes, 519a and 519b, to create a weld joint.

In addition to the first alignment holes 510, the strip carrier 500 is provided with second alignment or indexing holes 511 placed closer to its outer edges. These indexing holes 511 are used for alignment at later steps and for enabling a "walking beam" movement through automated feed-through equipment as will be later explained. A further description of the strip carrier 500 and its attachment to the wire bondable (TAB) tape may be found in the above-cited copending application, Ser. No. 07/380,174, filed Jul. 14, 1989, entitled "Strip Carrier for Integrated Circuits" which is incorporated here by reference.

In a variation of the above-described attachment of the tape to the strip carrier, the patterned tape 217 need not be cut into separate individual sections 400a-400d, but instead can be cut into elongated strips of four (or a different number of) continuous sections and these strips may be aligned in whole to the windows 502-508 of the strip carrier and welded to strip carrier 500 as such.

The welding step 518 of FIG. 5B may be performed with, for example, an HRS 50 C spot welding system manufactured by Hughes Aircraft Co. of California using parameters which are optimized for adhesion of the two metal layers, 14 and 500, without burning. One welding joint in each welding pad 14h is enough to secure the sections 400a-400d to the strip carrier 500 and hold the sections 400a-400d generally flat. Preferably, at least two welding joints, 522, 523 are attempted between each welding pad 14h and the strip carrier 500 to assure reliable connection thereto in mass production environments.

FIG. 5C illustrates a top plan view of two individual sections 400a and 400b, each being joined to the strip carrier 500 by two weld joints 522, 523 formed on each welding pad 14h. Welding step 518 provides both mechanical and electrical connection between the wire bondable tape sections 400a–400d and the strip carrier 500. Mechanical connection of the welding pads 14h to the strip carrier 500 helps to planarize the flexible tape sections 400a–400d and facilitates subsequent automated handling of the individual tape sections 400a–400d. Electrical connection of the lead fingers 14b to the strip carrier 500 facilitates a final tin plating process, described below. The resulting combination of tape sections 400 and strip carrier 500 is now referred to as a first strip assembly 551.

Note that a sectional line CC—CC is drawn through FIG. 5C cutting longitudinally through a lead finger on one side of the die-attach pad 14a (top half) and not cutting through a lead finger on the other side (bottom half). This sectional line CC—CC is generally followed in later-discussed cross-sectional views to show on a left side of each such cross-sectional view (i.e., FIG. 6B) an area through which a lead finger 14b passes and on the right side an area where the lead finger does not pass.

The first strip assembly 551, including its four individually aligned tape sections, 400a–400d, is now adaptable to be transported in industry standard transporting cartridges or magazines of a type used in conjunction with manual and/or automatic equipment employed for processing semi-rigid lead frames. Among these processing equipment are epoxy dispensing, die attach, and wire bonding equipment. As can be seen in FIG. 5C, the indexing holes 511 of the first strip assembly 551 are distributed longitudinally along its outer edges. These holes 511 are engageable by so-called "walking beam" indexing tools for automatically moving the first strip assembly 551 into and out of transport magazines and into and out of lead frame processing equipment. It is to be understood that all of the following assembly steps take place in a relatively clean environment such as provided by a class-1000 or better clean room.

Standard transporting cartridges or magazines are known in the art. Basically, the transport cartridge is a hollow elongated rectangular metal box with openings at each of its longitudinal ends. A plurality of longitudinally extending support rails are provided on two inner opposing walls of the cartridge to define slide grooves into which the semi-rigid lead frames are slid to enable clean, stress-free transport between processing stations The openings at the longitudinal ends of the cartridge are selectively opened and closed with slide doors to allow for automated insertion and removal of standard type rigid lead frame assemblies. The strip assemblies 551 of the present invention are slid into the cartridge grooves in place of the rigid lead frames, however.

Once a plurality of first strip assemblies 551 are produced, they are slid into the grooves of a transport cartridge and stacked as such within the cartridge in spaced-apart relationship. Each cartridge full of the first strip assemblies 551 is transported to the next described processing station of FIG. 6A.

Figure 6A:
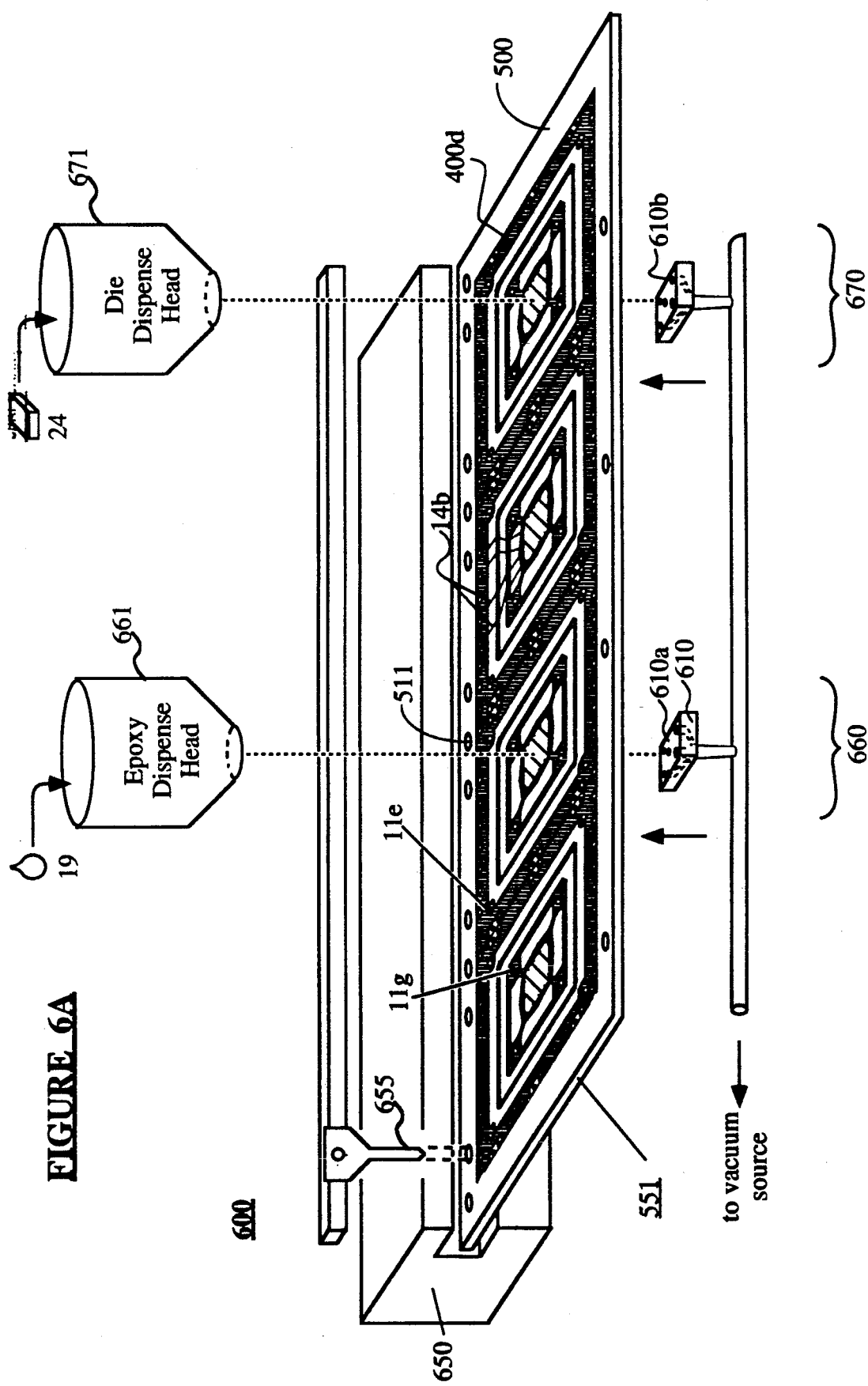
FIG. 6A is a perspective view showing how the strip carrier assembly is inserted into a vacuum-powered clamping fixture prior to die attachment.

As illustrated in the perspective view of FIG. 6A, each first strip assembly 551 is next slid through an epoxy dispense and die-attach station 600. The station 600 is similar to die-attach stations previously used for semi-rigid lead frames, except that various parts of the station 600 are now dimensioned and modified to be compatible with the tape-defined components of the first strip assembly 551. Included in the station 600 are a pair of opposing slide rails 650 (only one shown) for receiving opposed edges of the strip carrier 500 and for guiding the first strip assembly 551 through the station. A walking-beam actuator 655 engages the indexing holes 511 of the strip carrier 500 to sequentially move each tape section 400a–400d into a predetermined position, first within an epoxy-dispensing area 660, and then within a die-attach area 670.

In each of the epoxy-dispense area 660 and die-attach area 670, a tape planarizing pedestal 610 is provided to reciprocate upwardly into contact with the bottom side of an overlying die-attach pad 14a. The planarizing pedestal 610 has a substantially flat top surface 610a that is dimensioned to hold at least the die-attach pad 14a in planar form and to fix the position of the die-attached pad 14a at a predetermined location relative to an overlying epoxy dispense head 661 or die dispensing head 671. Five small vacuum line holes 610b are provided, evenly spaced, at the top surface 610a of the pedestal so that a uniform vacuum force can be applied to temporarily clamp the die-attach pad 14a flat against the planarizing surface 610 of the pedestal 610. The alignment apertures 11g and 11e of each tape section 440a–400d are used by automatic alignment means (not shown) of the station 600 to accurately position the epoxy-dispensing head 661 or die-dispensing head 671 of the station relative to the top side of each tape section 400 as that section is processed in respective areas 660 and 670.

At the epoxy-dispense area 660, a predetermined quantity of an electrically and thermally conductive die-attach adhesive 19 is dispensed onto each die-attach pad 14a from an overhanging needle (not shown). The die-attach adhesive 19 is a metal-filled epoxy resin having a thick paste-like consistency and exhibiting thixotropic-like flow characteristics necessary for reliable semiconductor die attachment purposes. Such epoxies are known in the art.

The dispensed adhesive 19 should have thermal properties compatible with subsequent processing steps described herein, such as a low curing temperature (i.e., equal to or less than the 160° C. glass-transition temperature Tg of the tape adhesive layer 10) and coefficients of expansion and glass transition temperatures compatible with the gold plating 13c and copper material 13a of the die pad 14a as well as to a next attached IC die (24). The dispensed adhesive 19 should also have a relatively low level of ionic impurities to minimize the potential for semiconductor device corrosion. Other desirable characteristics are high thermal and high electrical conductivity properties compatible with the requirements of the semiconductor die (24); minimum resin bleed out and minimum epoxy spreading during cure. By way of example, the die-attach adhesive 19 can be a silver-filled epoxy, such as Amicon 990C TM, manufactured by the Amicon Div. of Grace Incorporated, of Lexington, Mass. Other epoxies, such as the Ablebond 84 Series TM manufactured by Ablestik Laboratories of Gardena, Calif., and the H31 TM series silver-filled epoxies manufactured by Epoxy Technology Inc. of Billerica, Mass. can also be used. Epoxy dispensing equipment such as the ICON microprocessor-controlled semiautomatic epoxy dispenser, manufactured by ICON Inc. of Woburn, Mass., and the Shotmatic TM vacuum controlled manual epoxy dispenser, manufactured by Iwashita Engineering, Inc., of Japan may be used to dispense the adhesive 19. Manual combination epoxy-dispensing and die-attachment equipment is available also, such as the West-bond 7200A TM, manufactured by West-bond, Inc. of Anaheim, Calif. For the preferred embodiment, the die-attach step is automated to increase throughput and yield. Therefore, in the preferred embodiment, automatic adhesive dispensing and die attachment are performed by one-piece of equipment, such as the Shinkawa PA-30 Automatic Die Attacher TM manufactured by Shinkawa, Ltd. of Japan or the K&S Automatic Die Attacher TM, manufactured by Kulicke and Soffa Ind., Inc. of Willow Grove, Pa. Semiconductor die orientation relative to each wire bondable tape section 400 can be manually set by an operator or automatically established by an optical pattern recognition and alignment means of the automatic equipment using the alignment and pattern recognition openings 11g and 11e of tape section 400 and another alignment pattern (not shown) found on the semiconductor die 24.

Figure 6B:
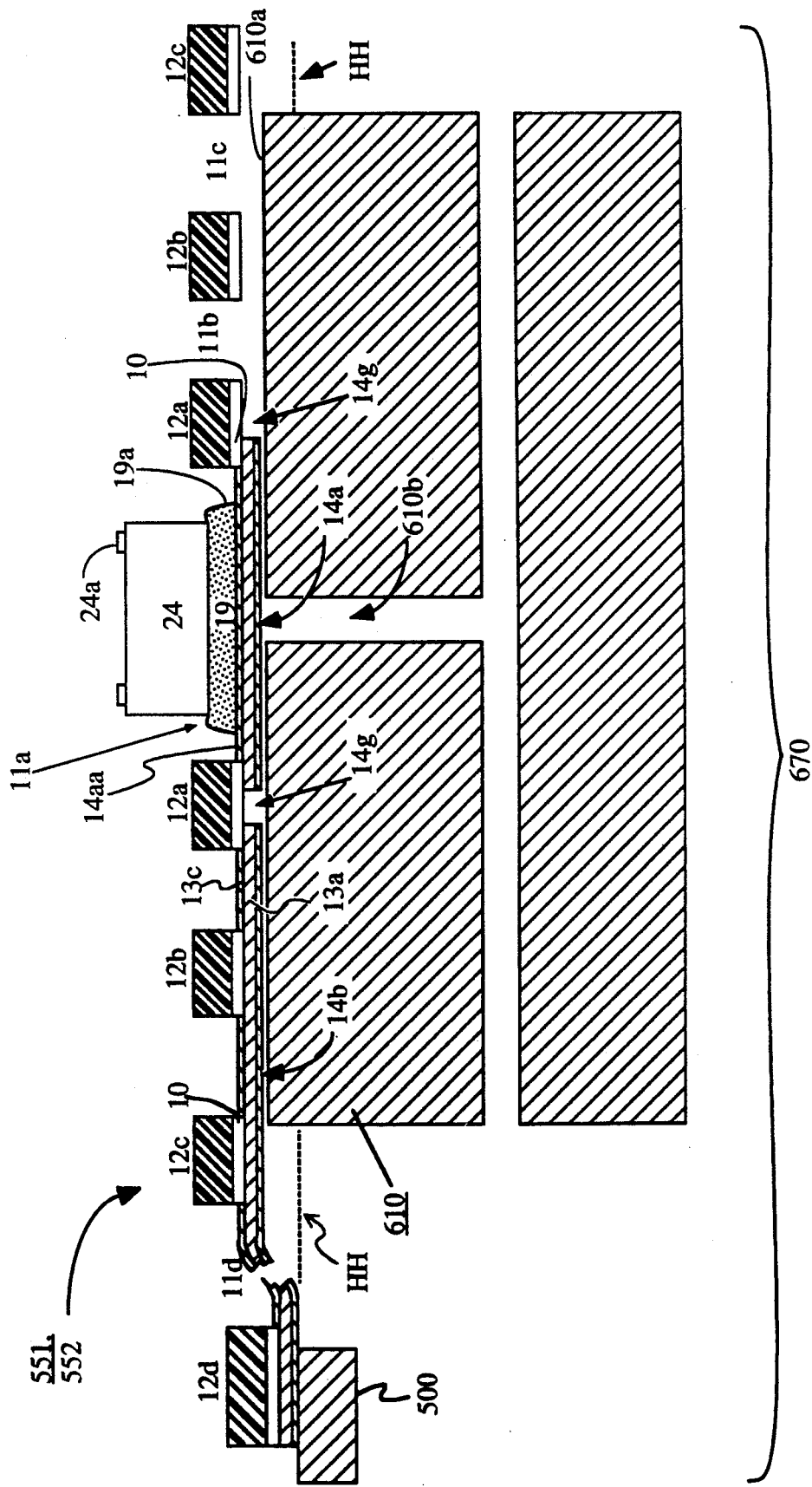
FIG. 6B is a cross sectional view which illustrates the strip assembly in the die-attach station of FIG. 6A after a semiconductor die is attached thereto with an adhesive

Referring next to the cross-sectional view shown in FIG. 6B, which is taken in accordance with a cut indicated by the cross-sectional line CC—CC of FIG. 5C (to show a left side having a lead finger 14b passing through and a right side without a lead finger), an IC die 24 having die contact pads 24a provided on its top surface is shown. The IC die 24 is adhesively joined at its bottom surface to the die-attach pad 14a by a predetermined volume of epoxy 19. The dispensed volume of die-attach epoxy 19 is selected such that at least two small fillet sections 19a extend beyond the periphery of the IC die 24 but such that their extent leaves exposed an annular surface portion 14aa of the die-attach pad; surrounding the die 24 and located just inside the first-encapsulant dam 12a.

The vacuum chuck pedestal 610 of the die-attach area 670 is shown pressing upwardly against a bottom central surface portion of the illustrated tape section 400 to counter an attachment pressure applied from the top side of the tape section 400 by the die dispensing head 671 (not shown) during the die-attachment process. It can be seen that the die-attach pad 14a is held in a planar form by the underlying pedestal surface 610a and that, further, the die-attach pad 14a is flexed slightly (e.g., less than 20 mils) above a hypothetical plane HH passing through outer ends of the lead fingers 14b and the strip carrier 500. The combination of first strip assembly 551 and the adhesively attached die 24 is referred to hereafter as a second strip assembly 552.

Upon completion of the die attachment steps (FIGS. 6A and 6B), several of the second strip assemblies 552 are collected into and transported together within a standard transport magazine to a curing oven (not shown) for curing the die-attach epoxy 19. A convection type air-vented oven manufactured by Blue-M Corp. of Blue Island, Ill., may be used. The magazine full of strip assemblies 552 is placed in the oven for a predetermined minimum time period of, for example, 60 minutes at a temperature of approximately 150° C. or slightly less in an air-vented atmosphere until the die-attach adhesive 19 is cured. A cure temperature of no more than approximately 150° C. is preferred because 160° C. is the minimum glass transition temperature Tg of the tape adhesive layer 10. The three-layer tape is guaranteed to hold together and not delaminate so long as the Tg of its adhesive layer 10 is not exceeded. Minimum temperatures and times for curing the die-attach epoxy 19 are established by the manufacturer of the epoxy and reported in the manufacturer's adhesive data sheets.

Referring to the cross sectional view of FIG. 7A (again taken in accordance with line CC—CC of FIG. 5C), after cure of the die-attach adhesive 19, the combination of the second strip assembly 552, cured epoxy (now referenced as) 19* and the attached die 24, which combination is referred to hereafter as third strip assembly 553, is transported within a cartridge to a wire-bonding station 700.

The wire bonding equipment (700) can be automatic or manual using either a thermosonic gold wire ball bonding or an ultrasonic aluminum wire wedge bonding technique both well known in the art. The preferred method of bonding is automatic thermosonic gold wire ball bonding using a Shinkawa, Model UTC-40 Automatic Thermosonic Gold Ball Bonder TM, manufactured by Shinkawa Ltd. of Japan. Automatic aluminum wedge bonders could be used, but are not preferred since gold is more resistive to corrosion than aluminum. Typical manual thermosonic bonding equipment includes the Mech-El 827 Gold Ball Bonder TM and typical manual wedge bonding equipment includes the Mech-El 907 Aluminum Wedge Bonder TM, both manufactured by Mech-El Ind., of Woburn, Mass.

The wire-bonding station 700 is similar in structure to the station shown by FIG. 6A in that station 700 has guide rails (650) and indexing means (655). For the sake of brevity, these are not shown in FIG. 7A. Each third strip assembly 553 is indexed on the guide rails (not shown) to overlie a vertically reciprocating wire bonding heater block 710 having a planar top surface 710a and five uniformly-spaced vacuum clamping holes 710b (only one shown). The heater block 710 moves upwardly to contact the bottom of the die-attach pad 14a and portions of the lead fingers 14b passing through the wire-bonding windows 11b, as shown. A vacuum source (not shown) is then operatively coupled to vacuum holes 710b to clamp the die-attach pad into a fixed position using vacuum pressure. The heater block 710 heats the die-attach pad 14a from below to a temperature which, at the heat source 712 is approximately within the range of 150° C. to 190° C., but because of loss to the ambient, the temperature at the wire bondable tape 216 does not exceed 150° C. in order to preserve the holding strength of the tape adhesive layer 10. The heater block 710 is designed to provide the requisite flatness and rigidity to each tape section 400 as necessary for the wire bonding process.

The bonding pads 24a at the top of the IC die are warmed by heat transfer. The lead fingers 14b are warmed by direct contact with the top surface 710a of the heater block 710. Alignment apertures 11g of the wire bondable tape expose the fine alignment cutouts 14f and 14q for visual scanning by automated alignment and pattern recognition means (not shown) of the wire bonding station 700 to allow proper positioning of a wire bonding head 720 relative to the semiconductor die 24 and to the lead fingers 14b of the wire bondable tape.

After the heater block 710 rises, a clamping tongue 730 having four downwardly projecting sections 731a–731d is brought down against the upper surface of the tape into pressing contact through the four wire-bonding windows 11b with all the lead fingers 14b of the tape to thereby fix the positions of wire-bonding portions in the lead fingers 14b relative to the heat block 710. Projecting sections 731a–731d are taller than the thickness of tape layers 10 and 12 so that the projections can clear the second insulator ring 12b to press against the lead fingers 14b.

Figure 7B:
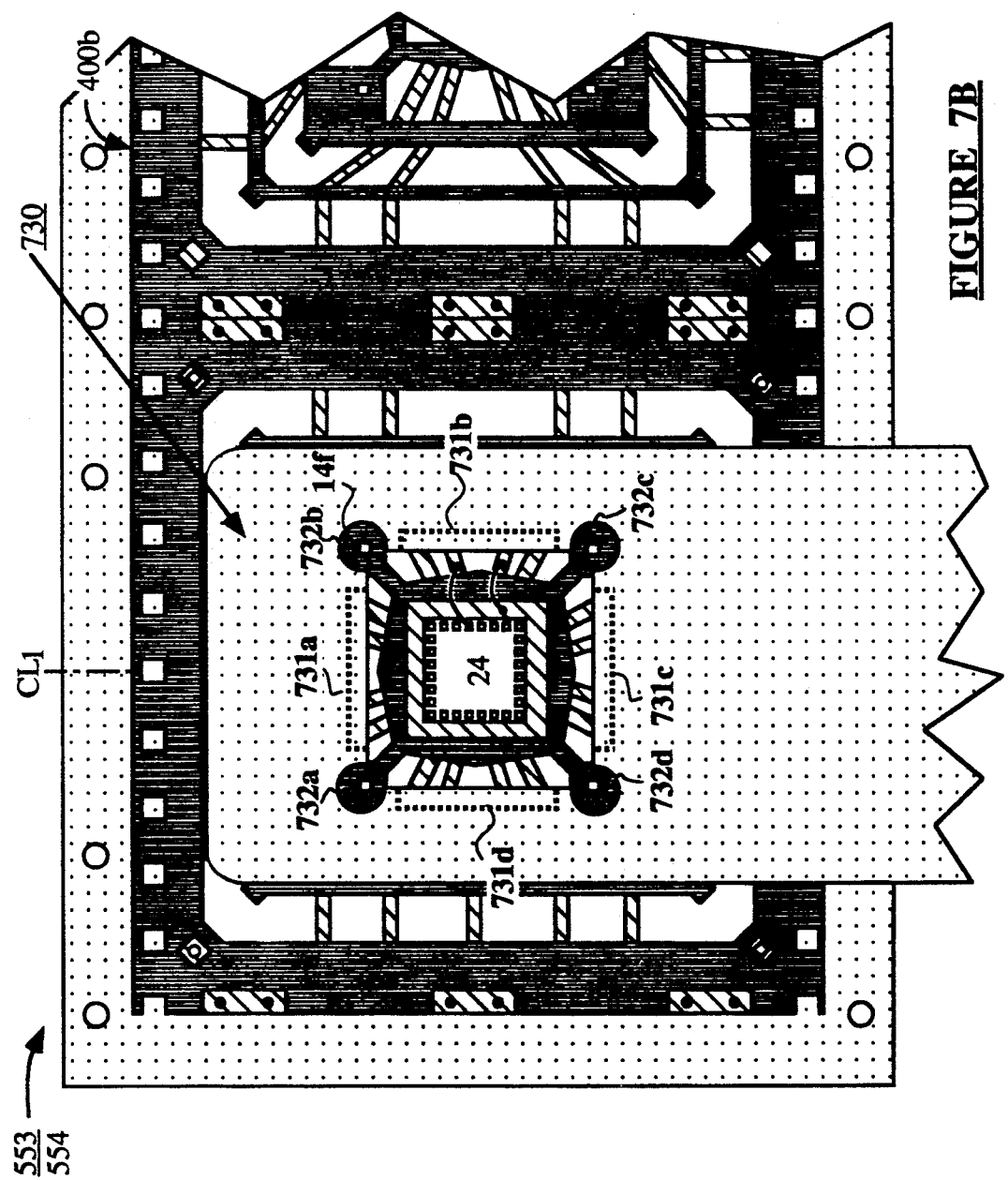
FIG. 7B is a top plan view of the structure shown in FIG. 7A.

The clamping tongue 730, which is also seen in the top view of FIG. 7B, further has four corner apertures 732a-732d for exposing through tape alignment holes 11e the fine alignment cutouts 14f and 14q. The tongue 730 also has a central window 733 for exposing the die 24 and wire-bondable inner portions of the lead fingers 14b.

Small segments of bond wire 26 are now formed and each bond wire segment is connected at one end to the bond pads 24a on top of the die 24 and at an opposed end to the wire-bonding regions of the lead fingers 14b through the wire-bonding apertures 11b of the tape to thereby electrically couple the bond pads 24a to the lead fingers 14b.

If backside biasing is desired and a fixed pin number has been selected for providing backside biasing to the IC die 24, such biasing can be provided through the biasing lead finger 14bb (FIG. 3A) which optionally merges with the die attach pad 14a. Alternatively, if the biasing lead finger 14bb is not included in the metal pattern 14, at least one down-bond wire 26aa may be joined at one of its ends to the annular region 14aa exposed on the die-attach pad and at its other end to a selected IC bond pad 24aa. This down-bonding connection 14aa-24aa is made because the punchouts, 11j and 11k, which were earlier made to remove the sacrificial insulator segments, 12e and 12f, also destroyed the electrical continuity between the die-attach pad 14a and the outer shorting ring 14d. As another alternative, or in combination with down-bonding wire 26aa, a jumper wire 26bb may be used to form a bridge from the annular region 14aa to a preselected lead finger 14b. Since the wire bonding connections 26 are programmed separately from the patterning of metal layer 14, one metal pattern 14 can be used with a wide variety of wire bonding options.

After all bond wires, 26, 26aa and/or 26bb, are joined to the lead fingers 14b and/or contact pads 24a, 24aa and/or region 14aa, the IC is protected from harmful electro-static discharge (ESD) by a shorting action provided by the outer metal ring 14d on the tape 217 and further by another shorting action provided by the conductive strip carrier 500. (The outer ends of lead fingers 14b preferably overlap and contact the window borders of the strip carrier 500.) Before the wire-bonding step is completed, it is advisable to keep the IC die 24 in a slightly humid atmosphere to prevent damage from ESD.

The automatic bonding equipment of station 700 can be programmed to automatically complete the wire bonding sequence of one semiconductor die 24 then index to the next tape section 400b on the strip assembly 553 and repeat the process, section after section, strip after strip, until all third strip assemblies 553 within a transport magazine have been wire-bonded. The strip assemblies, which now comprise bond wires 26 extending from the semiconductor die 24 to contact the lead fingers 14b will be referred to hereafter as fourth strip assemblies 554.

Referring to the cross sectional view of FIG. 8, the fourth strip assemblies 554 are now transported in cartridges to a die coating station 800. At the die coating station 800, a relatively viscous gel-like first encapsulating material 28, preferably composed of an ionically pure silicone gel mixture, such as HIPEC Q1-4939 TM, available from Dow Corning, is dispensed at room temperature (approx. 15° C.-25° C.) from a manual pneumatic syringe dispenser 820 manufactured by EFD over the top central surface of semiconductor die 24, as illustrated in FIG. 8 to flow uniformly over the die. The gel mixture 28 is composed of a resin and hardener, preferably mixed by weight (or volume) as 10 parts resin and 1 part hardener so as to minimize its viscosity prior to curing and maximize its flexibility after curing. Because it has a relatively low pre-cure viscosity, the gel mixture 28 spreads out uniformly from the center of the die 24 and over its periphery, to sealingly cover all portions except minor outer ends of the bond wires 26 and all portions of the exposed annular surface 14aa of the die-attach pad surface tension and a capillary effect cause the gel 28 to wick somewhat along the top surface of the first encapsulant dam 12a and on the bond wires 26 towards the outer areas of the tape section shown in FIG. 9B, but the gel also has a thixotropic property which keeps it from spreading further. The top outer edge of the first encapsulant dam 12a defines a 90° break which halts the surface-wicking flow of the gel 28. The top outer edge of dam 12a may also be used as a so-called "wedge" for supporting the bond wires 26 during wire bonding. Care should be taken to avoid trapping any air bubbles within the gel mixture 28 as it is applied over the die. Typically, the dispensing syringe 820 is moved in an empirically-developed spotting pattern over the top of the die to produce a uniform spreading action. One pattern found useful is to subdivide the die with hypothetical diagonal lines, deposit four first drops of gel over the line ends such that the first four drops overlap from the die corners down to the annular pad region 14aa and back up onto the top surface of the inner dam 12a. The first four drops guide later deposited gel across the die (24)-to-annular pad region (14aa)-to-inner dam (12a) boundaries. Four second drops are then deposited on the lines midway between their central cross point and their ends for further guidance. Finally, a larger spreading deposition is commenced at the cross point of the hypothetical lines to flow the gel uniformly outwardly to the outer top edge of the first encapsulant dam 12a and downwardly to adhere with the annular pad region 14aa.

The first encapsulant dam 12a temporarily holds back the flow of the silicone gel mixture 28 beyond the outer top edge of the dam 12a so the gel coating 28 remains in its applied thickness (i.e. approximately 5 mils) to fully cover the die 24 and major inner parts of the bond wires 26 (overlapping dam 12a) until an immediately following curing step takes place in which the gel mixture 28 is cured. After curing, the die coating is referenced as 28*.

It should be noted that during curing, the upper and side surfaces of the gel coating 28 are substantially unconstrained and that the bottom surface of the gel coating 28 is flexibly supported at its outer ends by the annular portion 14aa of the flexible die pad and by the first encapsulant dam 12a. If during the curing of the gel coating 28, stresses develop within the gel material 28, these stresses can be alleviated by upward strain through the free upper surface of the gel and by flexure of the underlying wire-bondable tape. Stress on the die 24 and its delicate interconnections 24a-26 is thereby minimized during curing of the gel 28. If desired, alumina or quartz particles may be mixed into the gel 28 to provide improved thermal conductivity. An example of such a thermal gel is XS-3183-40A TM available from Amicon Electronic Materials of Lexington, Mass.

After curing, the combination of the gel coating (which is now referenced as) 28* and the metal die-attach pad 14a define a relatively resilient and/or flexible protective barrier 28*/14a around the die 24 and its interconnections 24a-26. The metal material of the die pad 14a and the silicone material of the cured coating 28* inhibit inwardly-directed transport of moisture and corrosive chemicals to thereby block these from reaching the IC die 24. The resilient gel coating 28* further protects the die 24 from mechanical shock. After curing, the gel coating 28* preferably has a still sticky or tacky feel to it if hypothetically touched by a finger. This tacky feel gives the impression that the gel 28* is not yet fully cured, although it is. The IC die 24 is still flexibly suspended in the middle of the tape section 400 by the lead fingers 14b to the semi-rigid strip carrier 500.

As alternatives to the preferred HIPEQ Q1-4939 TM, a silicone gel such as the previously mentioned XS-3183-40A TM thermal gel (having alumina particles) manufactured by Amicon Electronic Materials of Lexington, Mass., or such as X3-6700 TM, manufactured by Dow Corning of Midland Mich., are also suitable materials for the die coating 28, and they may be empirically mixed to have the pre-cure viscosity and post-cure flexibility properties described above.

For optimum results, the gel 28 should be cured within 15 to 60 minutes after being dispensed to allow spreading but prevent skinning of the gel 28. The gel material 28 can be cured in a Blue-M oven, as described above, in a vented air atmosphere at a temperature of 150° C. or less for 2 hours or more. The cure schedule is established from the gel manufacturer's recommendations provided on the manufacturer's data sheet, keeping in mind that the glass transition temperature (160° C.) of the tape adhesive layer 10 should not be exceeded. Each fourth strip assembly 554 in combination with the cured silicone gel coating 28* is now referred to as a fifth strip assembly 555.

Figure 9B:
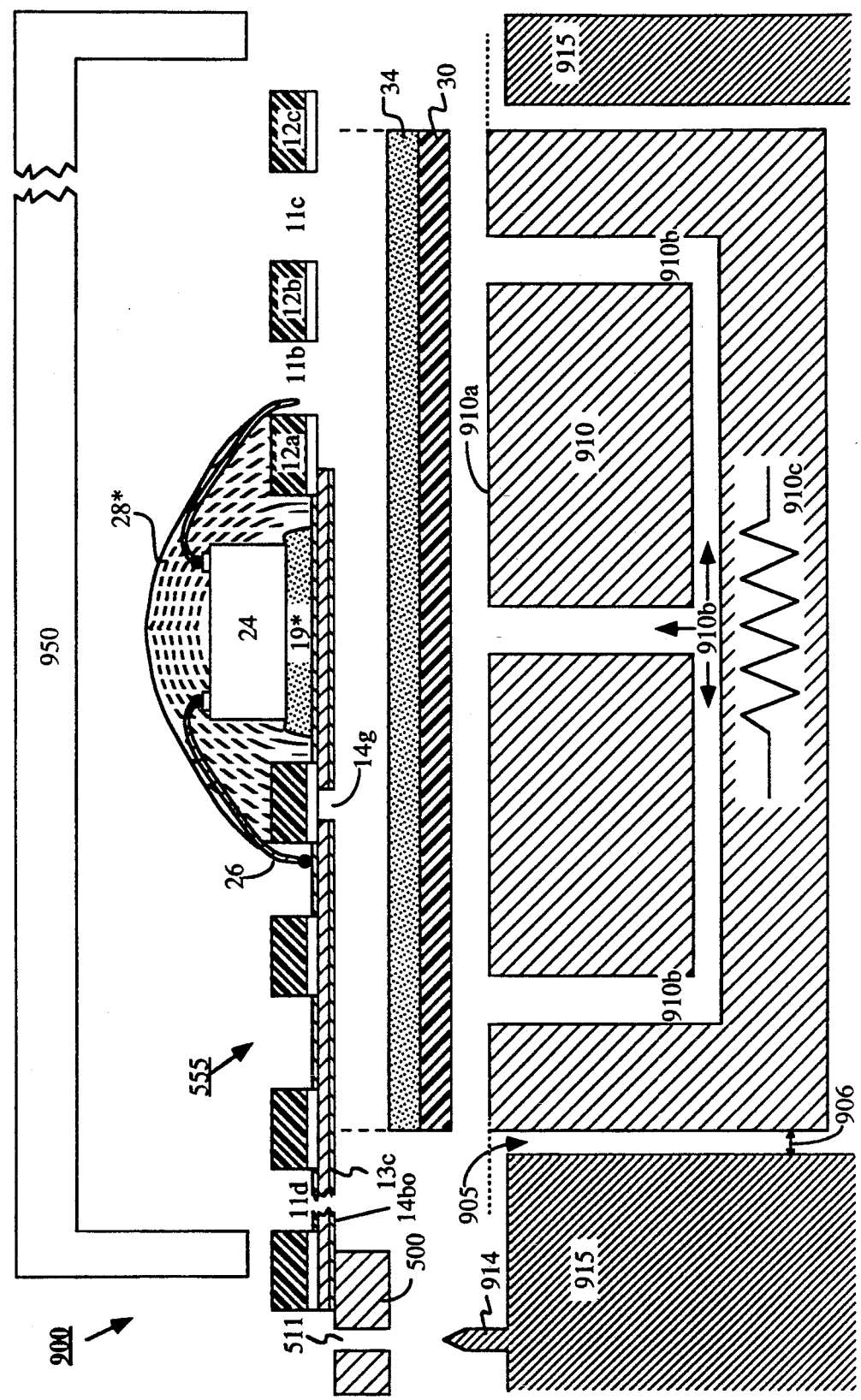

Referring to FIGS. 9A and 9B, pluralities of fifth strip assemblies 555 are next transported to a backside attachment station 900. At the backside attachment station 900, a square-shaped plastic tape 30 of dimensions approximately equal to or slightly smaller than the outer boundary of the third insulator ring 12c is attached to the bottom (backside) of the plated metal layer 14* using a first moisture-blocking adhesive 34. In one embodiment, the outer edge of tape-square 30 is positioned to align with a spot at least 10 mils inward of the outer edge of third insulator ring 12c but not more inward than the middle of third insulator ring 12c. The backside tape 30 is composed of an insulative and flexible material such as Upilex TM or Kapton TM (either is equally usable here) having a thickness of, for example, 3 to 5 mils. The tape square may alternatively be made of anodized aluminum or another appropriately insulated but flexible metal layer. The backside tape 30 is preferably pre-coated with a continuous layer of the first moisture-blocking adhesive 34 and the latter is preferably a B-stageable epoxy 34 having a thickness of approximately 1 to 3 mils. Backside tape 30 can be obtained precoated with a slightly but not fully cured film of Ablefilm 550 TM as the backside adhesive layer 34 from Ablestik Laboratories of Gardena, Calif. The backside tape-square and epoxy combination 30/34 should be stored in a dry refrigerator prior to attachment to inhibit cross polymerization of the B-stageable epoxy 34 and moisture absorption.

The backside epoxy layer 34 is dimensioned to continuously cover at least the backside area of tape section 400 from the third insulator ring 12c inwards so as to prevent moisture from moving to the IC die 24 through a backside channel (such as through the channel formed by backside gap 14g and then through polyimide ring 12a). At least an outer portion of outer-leads window 11d should be left uncovered by the backside tape 30 so that outer portions 14bo of the lead fingers 14b can be later attached at their bottoms to underlying traces of a target printed circuit board (not shown). The backside adhesive 34 should be a uniform, bubble free and pinhole free film of epoxy capable of wetting and strongly adhering to the (gold) metal surface 13c of the patterned metal layer 14*, particularly where the lead fingers 14b span across the epoxy seal windows 11c.

As shown in the exploded perspective view of FIG. 9A, the adhesive-covered backside tape square 30/34 is deposited in a square-shaped alignment well 905 of station 900 with the backside adhesive layer 34 positioned face up. The alignment well 905 is defined in a heat-retaining anvil (aluminum) 919 and is dimensioned just slightly larger than the backside tape combination 30/34 in order to easily receive the tape 30 and align it with a bottom central portion (including ring 12c) of the tape section 400. The continuous insulator gap 11jc and all tape section parts located inwards thereof will become covered at their bottom by the continuous layer of backside epoxy 34.

A heater block 910 having planar top surface 910a and five uniformly-distributed vacuum holes 910b defined therein is reciprocally positioned within the alignment well 905 to hold the received backside tape 30 (via vacuum pressure), to warm it and to soften the B-stageable backside adhesive layer 34 of the tape square until the adhesive 34 becomes tacky to the touch.

The heat-retaining anvil 915, which has the alignment well 905 defined at a central portion thereof, is mounted by springs 916 (or other resilient means) to a base heating portion 910c of the heater block 910 so that the anvil 915 can reciprocate downwardly relative to the top surface 910a of the heater block after the tape square 30/34 is deposited in the alignment well 905 and clamped to top surface 910a. Alignment pins 914 are provided at a top surface of the anvil 915 to hold the fifth strip assembly 555 in alignment with the backside tape combination 30/34. Heat passes across a well gap 906 from the heating block 910 to the anvil 915 so as to prewarm the anvil and the strip assembly 555 lying thereon. The fifth strip assembly 555 and tape square 30/34 will be at approximately the same temperature when they are pressed together.

Referring next to the exploded cross sectional view of FIG. 9B, a cup-shaped hand tool 950 made of a heat insulating material such as Teflon or a static-free plastic such as Delrin TM (available from E.I. Du Pont) is used to press down on the fifth strip carrier 555 and thereby lower the spring suspended anvil 915 until the backside adhesive layer 34 is pressed into contact with the bottom side of the metal layer 14* in the wire bondable tape. The applied heat of supporting block 910 and the slight hand pressure provided by tool 950 cause the backside adhesive 34 to soften, to attach to the bottom of die-attach pad 14a and begin to flow partially around the lead fingers 14b, into gap 14g and into insulator apertures 11b, 11c. A temperature of approximately 100° C. is developed at the heater portion 910c of block 910, but due to loss to the ambient, it is lower at the backside epoxy layer 34 (e.g., approximately 50°–75° C.). The hand pressure is applied for 20 seconds in order to heat stake (attach) the backside tape 30 to the fifth strip assembly 555. The backside adhesive 34 is not fully cured at this point but rather merely softened and adhered to the bottom of metal layer 14*. It is important to make sure that the backside adhesive layer 34 remains of uniform thickness here. To this end, if bubbles are noted at the end of the staking process when the hand tool 950 is lifted, the bubbles are smoothed out from the top side of the strip assembly using a cue tip or other suitable smoothing means.

The strip carrier assembly 555 is indexed through the backside-attachment station 900 and the backside-tape attachment process is repeated for each tape section until all sections 400a–400d have a backside tape square 30/34 heat staked to their metal layer 14*. Thereafter, the assemblies 555 are transported in cartridges to a reflow oven (Blue M) and held at approximately 150° C. in the oven for four minutes to soften and reflow (but not yet fully cure) the backside epoxy 34 so that it is uniformally distributed to partially surround each of the lead fingers 14b.

Figure 10A:
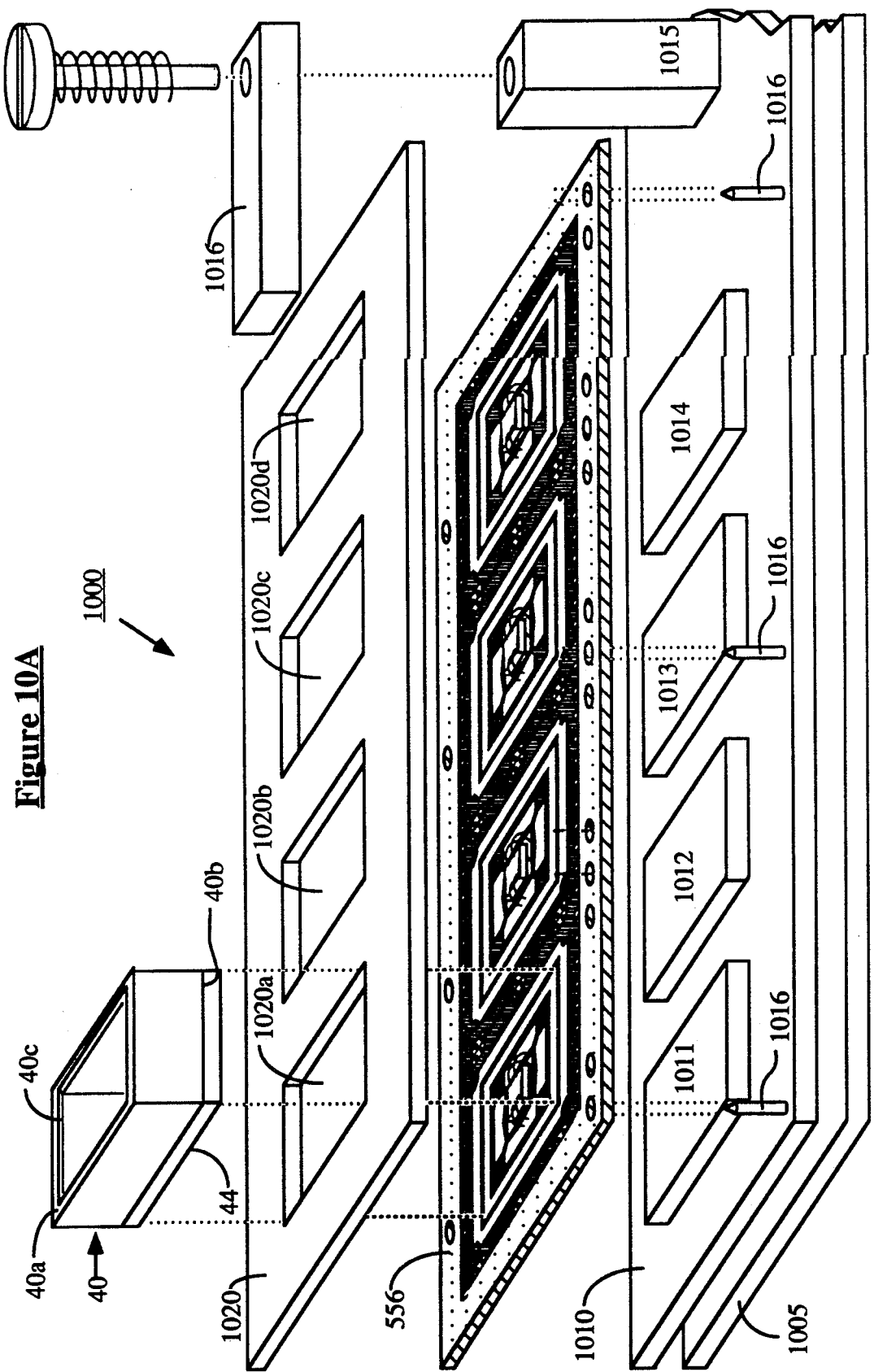
FIGS. 10A and 10B are respectively an exploded perspective view and an exploded cross sectional side view showing the attachment of a casting frame onto a topside of the strip assembly.

Referring next to the exploded perspective view of FIG. 10A, the resulting strip assemblies, now referenced as sixth assemblies 556, are moved to a frame alignment and attachment fixture 1000 for attachment to their top side of four annular-shaped casting frames 40 (only one shown).

In a first embodiment, each frame 40 is an open ended square tube of anodized aluminum (or another suitable insulation-coated metal such as a painted or otherwise insulated tube of copper, brass, an aluminum alloy, etc.) which has a narrow flat edge 40a at its top, an inwardly chamfered surface 40c just interior of the top, edge 40a and a flat bottom edge 40b. The frame has a height of less than 200 mils, which is preferably in the range 50-100 mils and more preferably in the range 50-60 mils. The thickness of the tubular frame 40 is also in the range 50 to 60 mils.

A B-stageable topside epoxy layer 44 having a square ring shape matching the square bottom edge 40b, of the frame and a thickness of approximately 1-3 mils is adhered to the bottom edge 40b. The topside epoxy 44 and bottom frame edge 40b are dimensioned to slide into the epoxy-seal gap 11jc and, by merger of the topside epoxy 44 with the backside epoxy 34, define a moisture-blocking epoxy-seal 34/44 extending throughout the continuous insulator gap 11jc.

In order to accurately slide the topside epoxy ring 44 into the insulator gap 11jc, each sixth strip assembly 556 is alignably fitted on an aluminum heater block 1010 of the fixture 1000 (using alignment pins 1016 and indexing holes 511). The heater block 1010 has four upwardly projecting pedestals 1011, 1012, 1013, 1014 integrally provided thereon to respectively support and hold flat the backside tape squares 30/34 of tape sections 400a–400d so that backside adhesive layers 34 are spaced apart from the lower top surface of plate 1010. Heater block 1010 is placed on a hot plate 1005 which is set to approximately 100° C. The sixth strip assembly 556 is thus prewarmed to a lower temperature (resulting from ambient loss) of approximately 50°-75° C. before the casting frame 40 and topside epoxy 44 is heat staked thereto.

As the strip assembly 556 is warming up, an aluminum alignment plate 1020 is alignably mated with pins 1016 of bottom plate 1010 and placed on top of the strip assembly 556. Alignment windows 1020a, 1020b, 1020c and 1020d are provided in the alignment plate 1020 to receive four respective casting frames 40 (only one shown) and to align them with the epoxy-seal gaps 11jc of respective tape sections 400a, 400b, 400c and 400d.

The topside adhesive 44 is preferably a B-stageable epoxy which is cross-polymerizable to and which has moisture-blocking properties similar to those of the backside adhesive 34. Epoxies 34 and 44 can be of the same material, but in the current embodiment, a different epoxy is used for topside layer 44, such as RJ-4B ™, manufactured by RJR Polymers Inc. of San Francisco, Calif. The topside adhesive 44 is preapplied to the ring frame 40 by the supplier, RJR Polymers, in a Beta stage form. It is preferably kept in a cool dry area prior to attachment in order to inhibit internal cross polymerization and minimize moisture absorption.

Figure 10B:
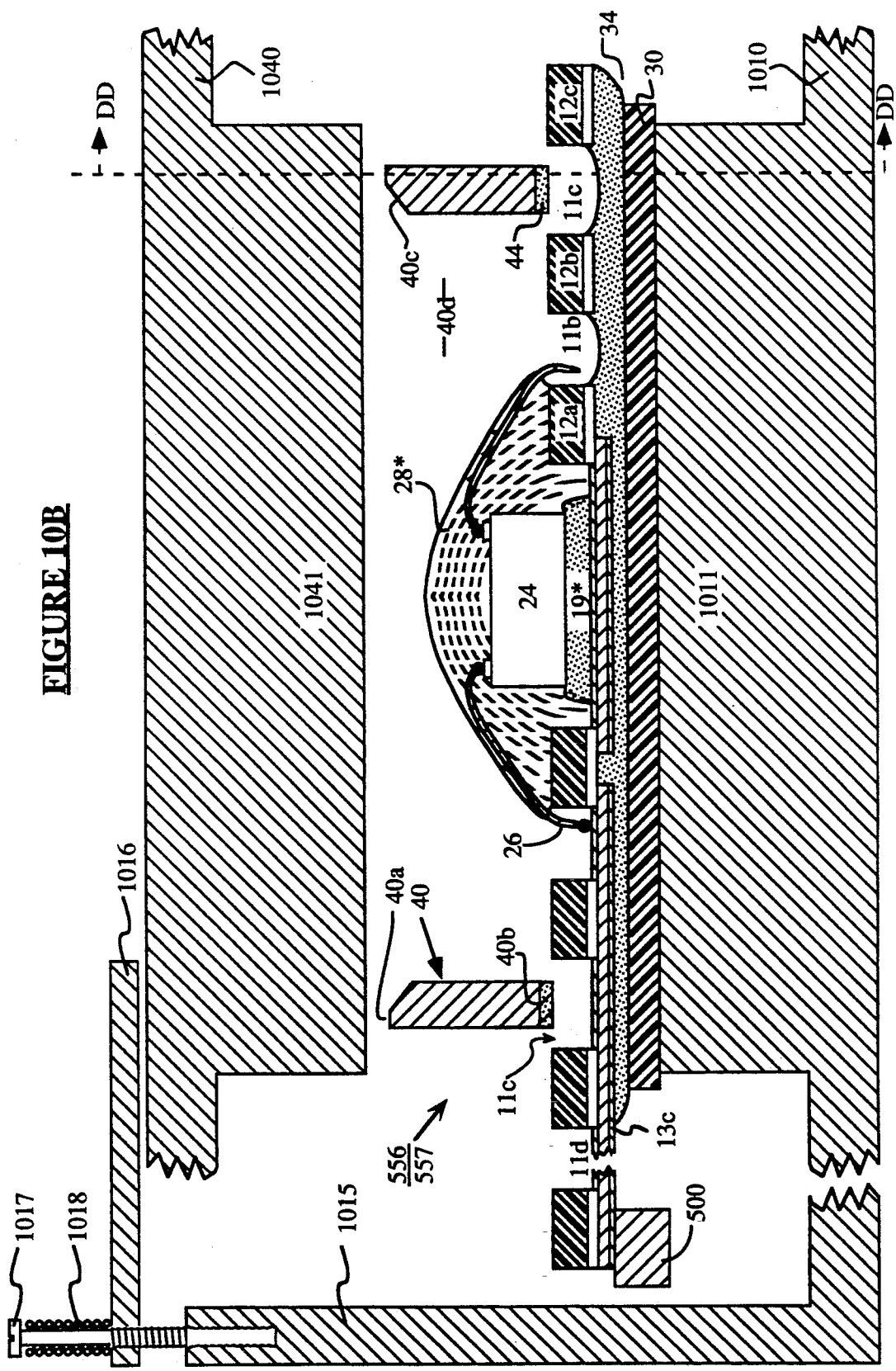

Referring to the cross-sectional view of FIG. 10B, a single tape section 400a is shown supported on a corresponding bottom pedestal 1011. Each bottom pedestal 1011 is dimensioned slightly smaller than its corresponding backside tape square 30/34 so that, if adhesive 34 is squeezed out slightly in the horizontal direction, the tape square 30/34 will not adhere to the support plate 1010.

Each casting frame 40 is slid through a corresponding alignment window (1020a, not shown in FIG. 10B) aligned and heat-staked with slight hand pressure onto its individual tape section 400. Heat staking is performed with the topside epoxy 44 being warmed to a temperature of aproximately 50°-75° C. and pressed for 20 seconds using an empirically determined amount of hand pressure. Relatively little or no curing takes place at this temperature, the topside epoxy 44 merely adheres to the top side of the plated metal layer 14*. Thereafter, the alignment plate 1020 is lifted off and an aluminum pressure plate 1040, which has been prewarmed to the 50° C.-75° C. temperature range and which is provided with four downwardly projecting pedestals 1041 (and 1042, 1043, 1044; not shown) matching the upwardly rising pedestals 1011 (1012, 1013 and 1014) of the heater block 1010, is positioned as shown in FIG. 10B to have a pedestal 1041 (1042-1044) resting on top of each of the heat-staked casting frames 40.

In addition to pedestals 1011-1014, the bottom heater plate 1010 has a pair of upwardly-projecting pressure poles 1015 (only one shown) provided, at opposed ends thereof for developing a predetermined level of pressure between each bottom pedestal, e.g. 1011, and its corresponding top pedestal, e.g. 1041. A pressing arm 1016 is reciprocally and pivotally mounted to the pole 1015 and is held thereto by a tightening screw 1017. A pressure-generating spring 1018 or another suitable pressure-generating means is interposed between the pressing arm 1016 and the head of tightening screw 1017. In the current embodiment, the tightening screw 1017 is adjusted such that the pressure between the top pedestal 1041 and the bottom pedestal 1011 is approximately 0.8 lbs/in$^2$±50%. (that is approx., in the range 4 psi-12 psi).

With the casting frame 40 and its underlying epoxy layer 44 thus pressed onto the topside of each wirebondable tape section 400, and the backside tape square 30/34 pressed against the opposing bottom of the TAB tape section, the assembled compression fixture 1010/1040 of FIG. 10B (which contains four tape sections) is placed in a curing oven (Blue M) so that the backside and topside epoxies, 34 and 44, soften, flow together and simultaneously cure under the applied heat and pressure. The oven is set to a curing temperature approximately equal to or less than the maximum 160° C. glass transition temperature of the tape adhesive layer 10. The compression fixture 1010/1040 is left in the oven for approximately 30 minutes. The recited temperature, time and pressure may be varied, of course, without interfering substantially with the adhesive flow and curing process. The cure schedule should be adjusted according to the manufacturer's recommended minimum cure instructions and is optimized empirically for minimizing production costs while not exceeding the limits of other materials (e.g., the adhesive layer 10) found within the compressed structure 556/557.

Figure 11:
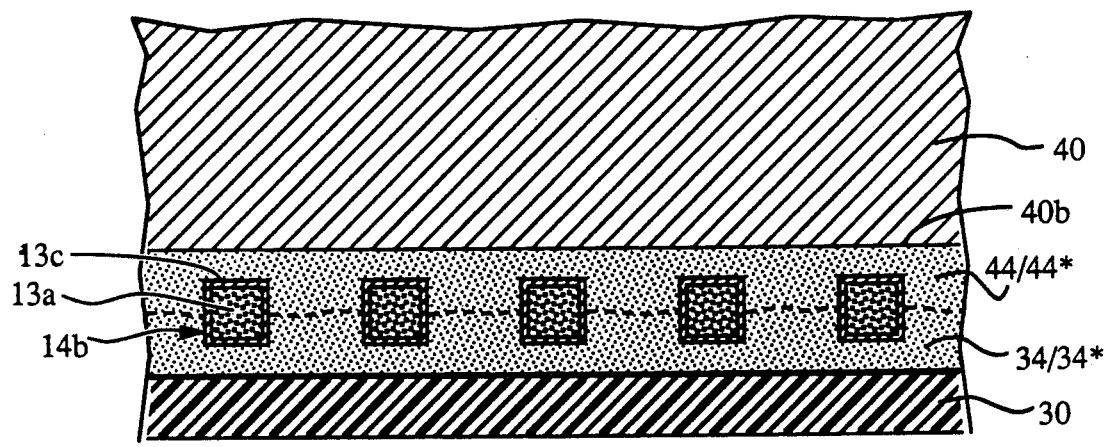
FIG. 11 is a cross sectional view of the patterned tape taken along line DD—DD of FIG. 10B to show the merger of the top and backside epoxies through the epoxy-seal gap.

Referring to FIG. 11, which shows a cross-section of the compressed assembly 557 taken according to line DD—DD of FIG. 10B, it can be seen that during the curing process, the topside and backside adhesives, 44 and 34, wet and flow around the exposed surfaces 13c of the lead fingers 14b in the region of the epoxy-seal windows 11c. The backside epoxy 34 and topside epoxy 44 join or merge throughout the epoxy-seal gap 11jc and cure together to form a continuous moisture resistant barrier 34*/44* around the IC die 24, as partially shown in FIG. 11, with the lead fingers 14b extending through a middle portion of the cured epoxy seal 34*/44*. The juncture of epoxy region 34 with epoxy region 44 is represented by a dotted line. In the actual embodiment such a line is not seen because epoxy region 34 merges smoothly into epoxy region 44. Preferably, after curing, the topside epoxy layer (now referenced as) 44* should be just thick enough (e.g., 1-3 mils) to prevent the bottom edge 40b of the metal frame 40 from contacting the lead fingers 14b (which are approximately 1.4 mils thick). At least the bottom edge 40b of the frame should be anodized or otherwise rendered electrically insulative so that even if it does somehow contact the lead fingers 14b, shorting will not take place. The thickness of the cured topside epoxy 44* should be minimized to be as thin sectional area DD—DD as practical, taking into consideration the allowed tolerances of a volume-production environment, in order to minimize the exposed surface area of the epoxy-seal 34*/44* after curing (as seen in FIG. 11). This area minimization reduces the chance of moisture leakage through the topside portion 44* of the cured epoxy seal 34*/44*. The casting frame 40 is preferably made of a metal (e.g. anodized aluminum) which is less moisture penerable than the epoxy barrier 34*/44* and thus its surface area is less of a cause for worry. Minimization of the thickness of the topside epoxy 44* also increases heat transfer from the lead fingers 14b to the metal frame 40 thereby allowing the latter metal structure 40 to act as an integral heat sink.

The curing pressure, curing temperature and the initial (pe-cur) thickness of the topside epoxy 44 are all empirically determined for simplifying mass production. The initial thickness of each of the topside and bottom side epoxies, 44 and 34, is currently set to 3 mils. Unlike the topside epoxy 44, the thickness of the backside epoxy 34 determines the effectiveness of the moisture seal around the die 24, not only in the region of gap 11jc, but also in the more interior backside regions of the structure (i.e., under gap 14g). It is therefore not desirable to make the backside epoxy layer 34 too thin (e.g., substantially less than 3 mils) for fear that pin hole defects will appear in mass production, resulting in moisture leakage through the backside epoxy layer 34*.

Figure 12B:
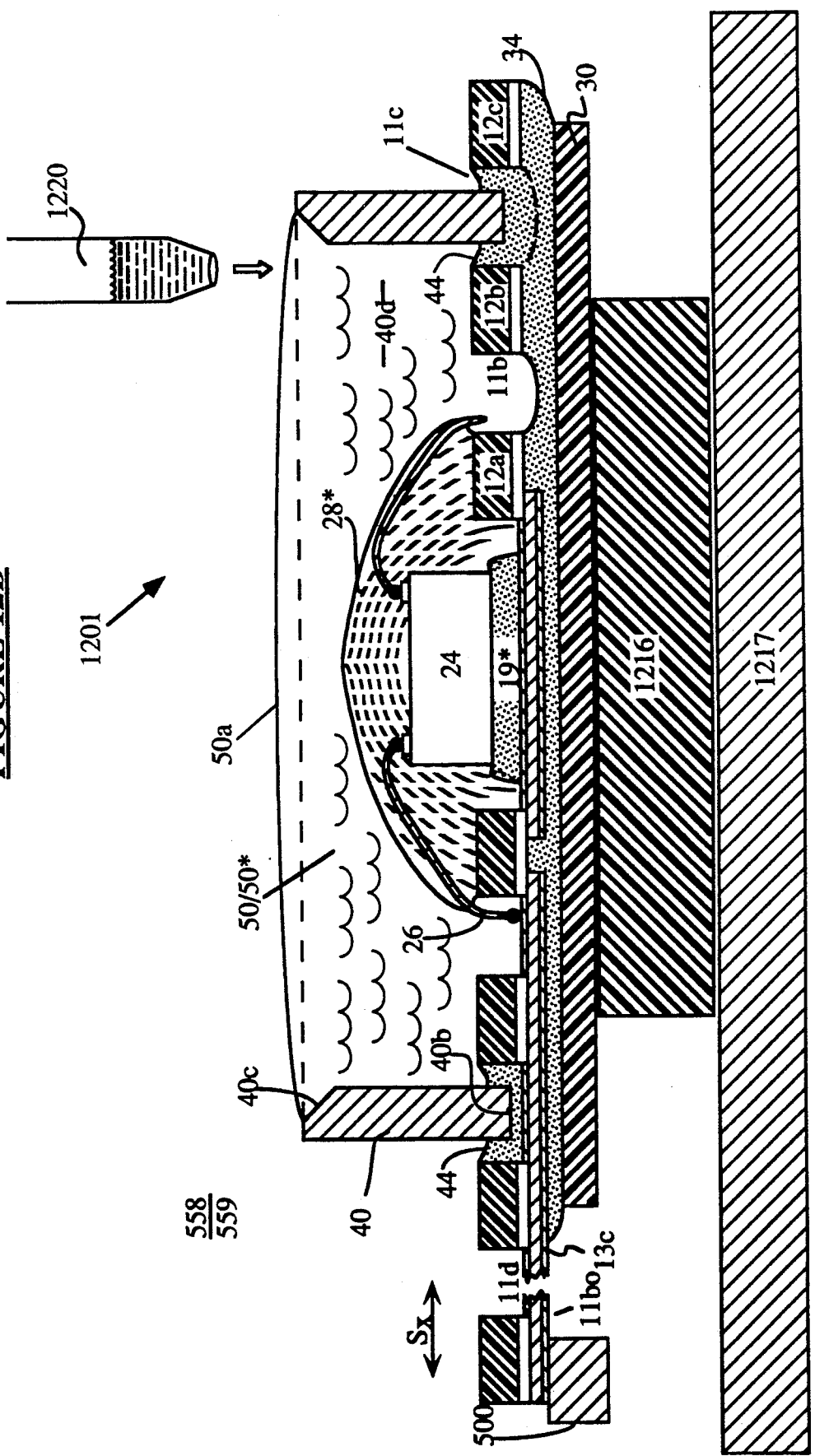
FIG. 12B shows a second fixture for biasing the flexible packaging substrate toward a planar form.

When the curing process is complete, the combination of the strip assembly, backside tape square 30/34* and topside frame 40/44*; which combination is now referred to as seventh strip assembly 557, is removed from the compression fixture 1010/1040 and pluralities of such strip assemblies 557 are transported in a suitable cartridge to a next encapsulation station 1200 shown in FIG. 12A.

As seen in the cross-sectional view of FIG. 12A, a second encapsulant 50 is now introduced into the interior cavity 40d of the casting frame 40 from a syringe dispenser 1220 provided at encapsulation station 1200. The second encapsulant 50 is preferably a low viscosity epoxy mixture (uncured) which can flow readily into the cavity 40d created by inner walls of the casting frame 40, the topside epoxy 44* and the backside epoxy 34*. The second encapsulant 50 should fill all small crevices and voids in this cavity 40d. A low stress, moisture-blocking, semiconductor encapsulant such as ES4438 TM manufactured by the Hysol Division of Dexter Corp. of Industry California is preferred for the second encapsulant 50. A flame retardant encapsulant such as ES4328 TM, again available from Hysol, may also be used. A variety of other phenol-formaldehyde based epoxies known to the trade may be used as alternatives.

The second encapsulant 50 is received in a premixed, frozen and degassed form from the manufacturer (Hysol). The frozen encapsulant is placed in a suitable dispenser such as a manual pneumatic syringe dispenser manufactured by EFD and warmed to a temperature of approximately 50° C. to 60° C. so as to minimize its viscosity while avoiding higher temperatures at which substantial cross polymerization starts to occur.

The dispenser syringe 1220 is moved peripherally in a circular motion around the inner edges of the casting frame 40 while the second encapsulant 50 is being dispensed into the frame cavity 40d. This is done to make sure that the second encapsulant 50 fills the cavity 40d from the bottom up so as to uniformly cover all exposed portions of the bond wires 26 and all other crevices and/or voids present within the interior 40d of the casting frame 40. If the second encapsulant 50 is dispensed directly on top of the bond wires 26, the exposed outer ends of the bond wires which are not encased in the first encapsulant 28*, can disadvantageously produce an umbrella effect wherein air bubbles are trapped under the bond wires. Care should be taken to prevent air bubbles from forming within the dispensed fluid 50 since this may interfere with the moisture blocking function of the second encapsulant 50.

The semiconductor die 24 and bond wires 26 remain substantially undisturbed by the potting epoxy 50 as it is dispensed. The first already-cured encapsulant 28* protects the semiconductor die 24 and inner portions of the bond wires 26 from any stresses associated with the dispensing step. Potting epoxy 50 spreads to cover the still-flexible floor (backside epoxy layer 34*) of the frame cavity 40d, and rises to a level where it surrounds the top and sides of the gel-coated semiconductor 24. The potting epoxy 50 also contacts and adheres to the inner wall surfaces of the casting frame 40 and the topside epoxy 44 so as to completely and uniformly fill the frame cavity 40d up to a height intersecting with the top edge of the inward chafer 40c defined on the casting frame 40.

The inward frame chafer 40c is angled at approximately 45° to partially cancel a meniscus-forming tendency of the second encapsulant 50 and to thereby give the top surface 50a of the now-dispensed encapsulant 50 a domed topology which is substantially flatter than would be possible if chamfer surface 40c met the top surface 40a of the casting frame at a 90 degree angle. A hypothetical flat line is drawn in dashed form under the domed top surface 50a for reference. The substantially flatter but still domed shape of surface 50a simplifies later manufacturing steps in which the top of the soon-to-be completed package is labelled with ink from a pad-printing apparatus and a further step in which the completed package is manipulated by a vacuum-powered pick and place apparatus during board mounting.

The strip assemblies (which are now referenced as) 558 are mounted into curing fixtures 1210 either before or after the potting epoxy 50 is dispensed. The purpose of the curing fixture 1210 is to hold the still-flexible bottom tape layers, 10/12/14 and 30/34*, relatively flat within a curing oven (Blue M) as the potting epoxy 50 cures slowly at 150° C. over a period of approximately 4.5 hours or longer in an air vented atmosphere. The curing fixture 1210 has a planarizing top surface 1210a made of aluminum that is dimensioned to fit into each of the strip carrier windows (502–508) and a plurality of vacuum holes 1210b (one shown). A rubber ring 1215 is placed in a square shaped trough whose dimensions match and oppose the square bottom edge 40b of the casting frame 40. A slight vacuum pressure of no more than 10 to 22 inches of mercury is applied through the vacuum holes 1210b to urge the bottom tape square 30 flat against surface 1210a. The rubber ring 1215 assures a proper vacuum seal and recedes just to the level of the planarizing surface 1210a as vacuum pressure builds up. The pressure is enough to urge the bottom tap 30 into a planar form at the global scale but not so high that local deformation of the still flexible packaging substrate (composed of layers 12, 10, 14, 34* and 30) is impeded within the inner boundary of the casting frame 40. Without planarizing surface 1210a, the flexible packaging substrate tends to bow downwardly due to the weight of the second encapsulant 50. Such downward bowing is undesirable because it may interfere with a later board mounting step in which the package backside layer 30 may have to lie flat against the surface of a printed circuit board. If desired, the vacuum holes 1210b, rubber ring 1215 and its trough may be omitted from fixture 1210 in which case the weight of the strip assembly 558 is relied on for unbowing the packaging substrate against surface 1210a. Alternatively, as shown in the embodiment 1201 of FIG. 12B, a relatively pliable rubber pad 1216 having length and width dimensions slightly smaller than those of the casting frame 40 is placed under the packaging substrate to push up on and thus unbow the packaging substrate. An aluminum tray 1217 supports the pad 1216. If bowing is not a concern, then the strip assembly 558 can be cured while it simply rests on the inner rails of a transport cartridge.

As cross polymerization takes place within the curing epoxy 50, substantial stresses can begin to build up within its material. Unlike prior art transfer molding steps, however, the top of the casting frame 40 is open and thus allows stresses to be alleviated by upward strain at the top surface 50a of the curing epoxy. The combined tape structure (layers 12, 10, 14, 34*, 30) which supports the bottom of the curing epoxy 50, is flexible enough (despite the applied vacuum pressure of holes 1210b in FIG. 12A) to provide further local-scale relief for stresses developed near the bottom of the casting frame 40. The resilient gel coating 28* which protects the IC die 24 at its top and sides provides further relief for stresses generated during curing of the second encapsulant (potting epoxy) 50. The epoxy materials of the second encapsulant (Hysol ES4438 TM) 50 are preferably selected so as to minimize their self-generated stress during curing. Hence, the magnitude of disruptive forces which can lead to microcrack formation an breakage of delicate interconnections between the IC die 24 and the lead fingers 14b is minimized during curing.

After the curing of second encapsulant (now referenced as) 50* is complete, the IC die 24 is surrounded by two moisture blocking barriers. The first moisture barrier is defined by the metal of die-attach pad 14a and the cured glob of silicon gel 28*. The second barrier surrounds the first barrier and is defined by the union of: (a) the cured backside epoxy layer 34*, (b) the cured topside epoxy layer 44* (and the metal lead fingers 14b passing through the merged backside and topside epoxies), (c) the metal casting frame 40 and (d) the cured second encapsulant 50*. The metal casting frame 40 provides rigidity to the overall structure and the lead fingers 14b extend flexibly beyond the outer periphery of the casting frame 40.

A complex set of thermal-mechanical interactions take place between the materials of the cured package (now referenced as 559) when, at a later stage, the package 559 undergoes reliability qualification tests, including extensive thermal cycling and pressure pot testing. The coefficients of thermal expansion (COTE) which are attributable to the cured epoxy materials, 34*, 44* and 50* are approximately equal; as are the Young's modulus (Y) of these materials. The coefficients of thermal expansion and Young's modulus of the metal lead fingers 14b and the metal casting frame 40 are preferably the same and at least within one order of magnitude of each other. At 150° C., the package 559 is relatively planar in form and unstressed internally since this is the temperature at which each of the epoxies (34, 44, 50) was cured. As the package cools during temperature cycling (to temperatures as low as minus 65° C.), the epoxy materials 34*, 44* and 50* begin to shrink inwardly against the resilient silicon gel 28*. The casting frame 40 shrinks inwardly at a different rate area. The delicate lead fingers 14b are caught between the two differently shrinking materials. Experiments show that a critical level of horizontal stress $S_x$ develops in the lead fingers 14b just where the lead fingers pass under the casting frame 40. Computer simulations (using the ANSYS TM finite element analysis program available from Swanson Corp.) indicated that these undesirable stresses $S_x$ can be minimized when the casting frame 40 is provided with either one of or more preferably both of a relatively high coefficient of thermal expansion (e.g. in the range COTE=3 ppm to 30 ppm and more preferably around 10 parts per million) and a relatively high Young's modulus (e.g. in the range Y=5 Mpsi to 20 Mpsi and more preferably around 10 Million pounds per square inch). For cost effectiveness, it was determined that aluminum, which as a relatively high Young's modulus (Y=8.0 Mpsi) but low coefficient of thermal expansion (COTE=1.33 E-05 parts per degree F), would provide the optimal material for the casting frame 40. Other materials such as copper, brass and various metal alloys having COTE and properties within or substantially near the above recited ranges are also contemplated.

Figure 13A:
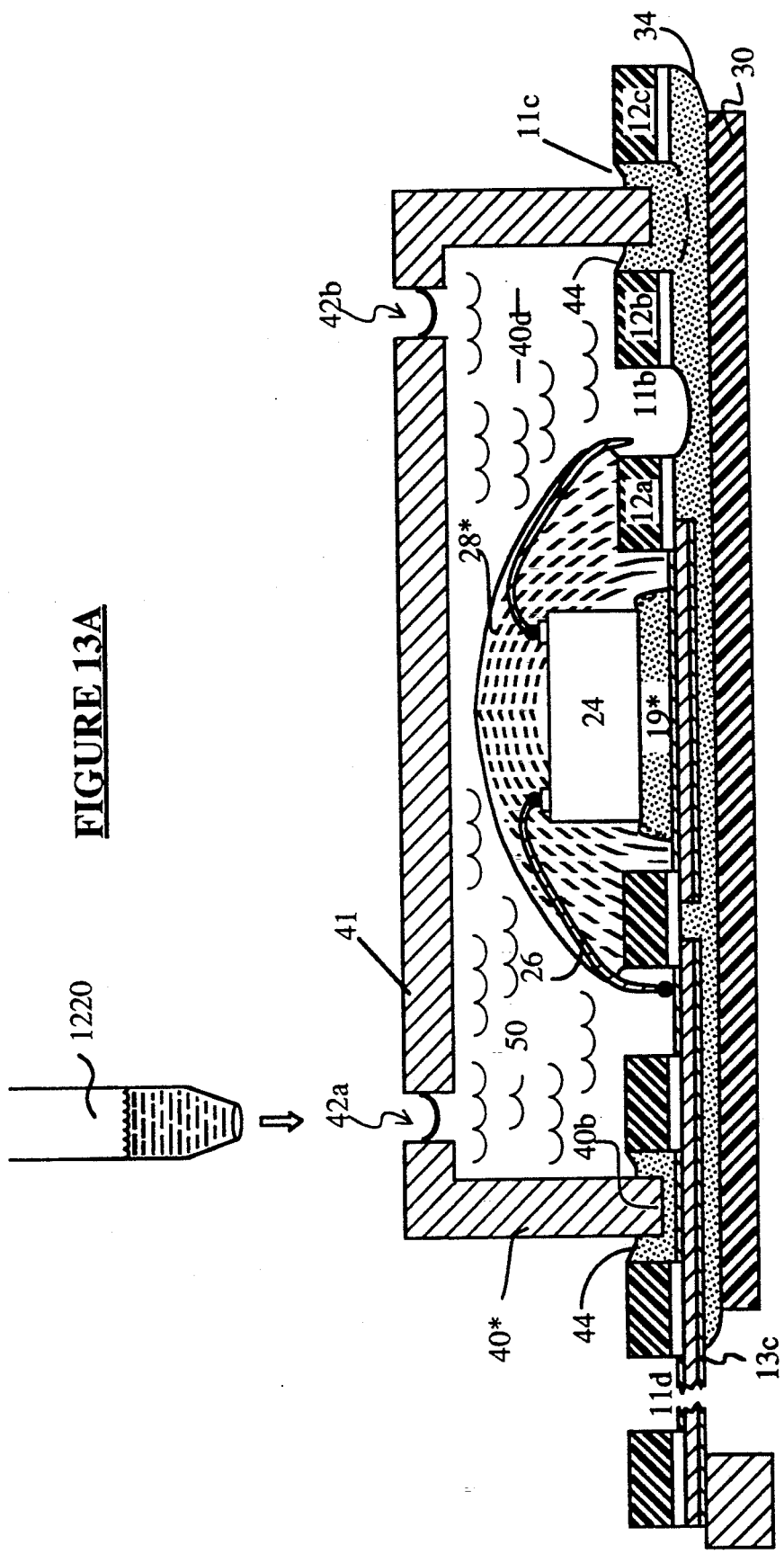
FIG. 13A is a cross sectional side view of a second embodiment of the present invention wherein the casting frame defines an integral, metallic heat sink.
Figure 13B:
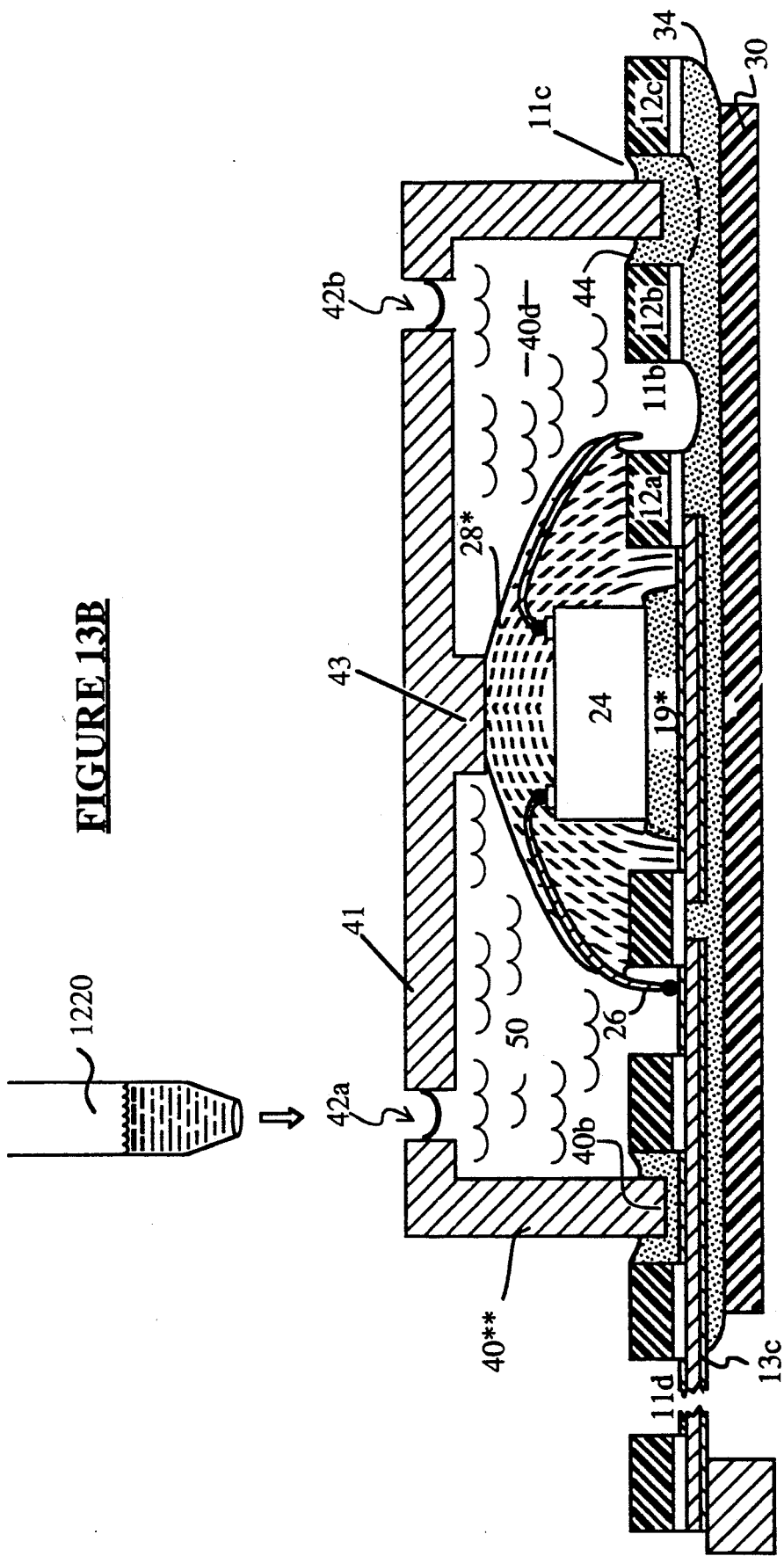
FIG. 13B is a cross sectional side view of a third embodiment including a downwardly projecting heat conductor.
Figure 13C:
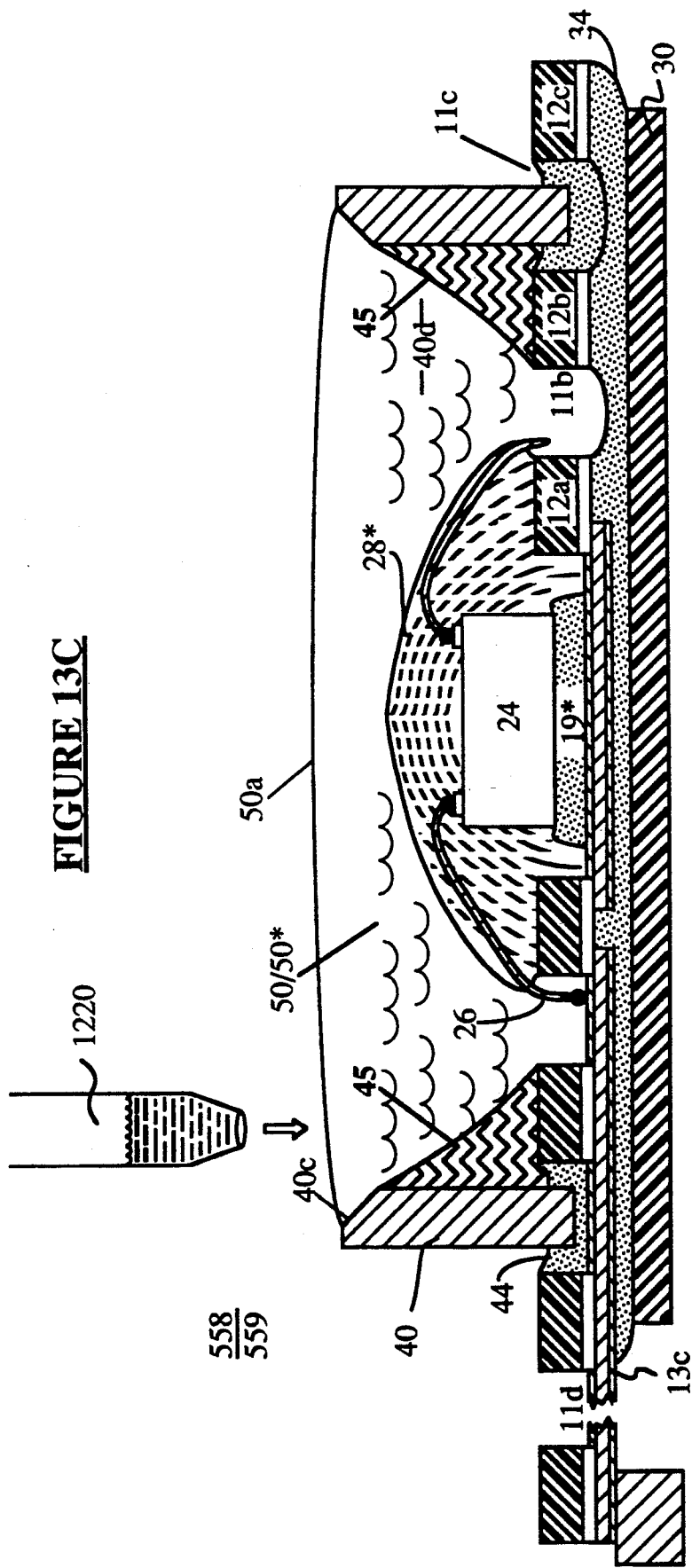
FIG. 13C is a cross sectional side view of a fourth embodiment including a resilient inner wall stress buffer.

To further reduce the stress $S_x$ on the lead fingers 14b, it is also contemplated to coat the inner walls of the casting frame 40 with a silicone gel buffer 45 prior to pouring in the potting epoxy 50 as shown in FIG. 13C, but of course, this step increases production costs.

Referring to FIG. 13A, in a second embodiment of the invention, an aluminum cover plate 41 having a substantial flat top surface is integrally formed on top of the casting frame, which is now referenced as frame 40* (made entirely of anodized aluminum). Two epoxy dispense holes, 42a and 42b, are provided at opposed diagonal corners (see also FIG. 14) of the cover plate 41. The potting epoxy 50 is dispensed through one of these holes 42a from a dispensing needle 1220 and air is exhausted through the other hole 42b. The dispense rate should be set to minimize air bubble formation within frame cavity 40d. The dispensing process is completed when the potting epoxy 50 is seen to begin emerging from the exhaust hole 42b.

The aluminum cover plate 41 provides a further level of protection against moisture penetration. It also further enhances the heat sinking capability of the metal casting frame 40. A bulk of the heat generated by the IC 24 during operation moves upwardly through the silicone gel 28*, passes through the thinner portions of the second encapsulant 50*, and from there, transfers directly to the top cover 41 of the casting frame 40* to be radiated outwardly to the ambient. The distance between the frame cover 41 and the silicon gel 28*, at the thinnest portion of the second encapsulant 50*, is preferably on the order of 5 miles or less. The casting frame 40* may be machined out of solid piece of aluminum, or it may be cast using a powdered metal technique or it may be formed by other cost effective techniques.

Referring to FIG. 13B, another form for the casting frame (now referenced as) 40 is shown. In this form 40, a heat sinking projection 43 descends integrally from cover plate 41 to contact the silicone gel 28* centrally over the IC die 24. The distance from the top surface of the die 24 to the bottom of the integral heat sinking projection 43 is preferably around five mils or less. The width of the heat sinking projection 43 needs to be dimensioned sufficiently small so that it does not contact with and short the upwardly and outwardly extending bond wires 26.

Semiconductor die 24 can dissipate as much as 3 Watts of heat or more during normal use. Aluminum frame 40*(*) with or without heat sink 42 facilitates the removal of this dissipated heat, thereby providing longer operational life to the semiconductor die 24 and allowing the die 24 to operate at higher switching frequencies. The flat cover 41 without the projection 43, as shown in FIG. 13A, is preferred because it is more adaptable to wide variations in the sizes of the semiconductor die 24 and the wire bonds 26. If the bottom tape square 30 is made of the anodized aluminum this further helps to dissipate heat.

Referring to the cross sectional side view of FIG. 13C, there is shown another embodiment of the invention in which a buffer region 45 composed of a resilient buffer material such as silicone gel is coated onto the interior side wall of the open-top casting frame 40 just prior to the step where the potting epoxy 50 is next dispensed by dispensing the gel against the chamfer surface 40c, allowing it to flow to the inner top edge of second ring 12b and curing it in the illustrated form. Computer stress simulations indicate that the buffer region 45 helps to further educe stress $S_x$ on the lead fingers 14b during temperature cycling.

The cured package assemblies, whether using the frame form 40 of FIG. 12, the frame form 40* of FIG. 13A, the frame form 40** of FIG. 13B or the buffered structure of FIG. 13C, will be now referred to as packaged assemblies 559. The package assembly 559 without its strip carrier 500 will be referenced to as packaged device 1400. The top surface of each such formed IC package 1400 is substantially planar and thus readily adaptable for processing by automated package labelling equipment.

Referring to the top plan view of FIG. 14, the packaged strip assemblies 559 are transported to an identification marking station where the top surface of the IC package 1400 (the top of frames 40* or 40** is shown) are marked by an automated pad stamping machine. Each IC package 1400 is still supported on the strip carrier 500, and thus automated processing is greatly facilitated.

A marking ink 1430, which is typically an epoxy-based ink manufactured by AIS is printed onto the top of surface 1450 of each individual IC package, 1400a, 1400b, 1400c, 1400d (only two shown). The stamped strip assemblies (now 560) are transported to a standard curing oven (Blue M) in a cartridge, and the marking ink is cured in an air atmosphere at 150° C. or a lower temperature for approximately 30 minutes or as otherwise specified by the marking ink manufacturer. Needless to say, the glass transition temperature (i.e., 160° C.) of the tap adhesive layer, 10, should not be exceeded.

In some instances, it is desirable to replace the gold outer plating 13c of the exposed outer portions 12bo of lead fingers 14b (the portions in outer-leads windows 11d) with tin-plating. The marked and cured packages 1400a-d are next optionally shipped still on strip assemblies 560 to a plating house such as Hytec of Arizona for stripping the exposed outer portions 14bo of the lead fingers 14b and replating them with a solder-adherable plating according to the requirements of various end users. The marked strip assemblies 560 are mounted on a plating rack to hang from strip carrier 500. All exposed and electrically conductive metal surfaces, such as the outer contact leads 14bo exposed by fourth apertures 11d; welding pads 14h exposed by fifth aperture 11h; and shorting ring 14d are all typically electroplated with 85% tin and 15% lead solder. (The anodized and electrically isolated casting frame 40, 40* or 40** is not plated.) Alternatively, plating layer 13c is not stripped off but instead, an interfacial nickel layer is added to the outer lead portions 14bo prior to tin plating.

The tin plated strip assemblies, are now placed in a cutting fixture to singulate out the individual package units 1400a-d from the strip assembly 560, by excising according to a first excision line 1450 shown in FIG. 14 (or 1450* in FIG. 3D). The contact leads 14bo are now separated from the outer shorting ring 14d and from the strip carrier window 502, leaving the individually packaged devices 1400a-1400d respectively, with electrically isolated and flexible contact leads 14bo extending radially therefrom. Strips of the outer insulative ring 12d may be left attached outer tips of the contact leads 14bo to hold the latter in alignment, or if desired, the excision cut 1450 can be modified to cut the contact leads 14bo just short of the outer insulator ring 12d so they hang free. The singulation equipment is typically a punch tool manufactured by a tool and die maker, such as Innercon Tool of California, which preferably excises the contact leads 14*bo* without stress damages to the leads or plating thereon. Singulated devices 1400 are picked up from the singulation tool by vacuum and immediately placed in an ESD-resistant slide carrier for electrical testing. After successful testing, a second excision cut is made according to line 1460 (or 1460* of FIG. 3D) at which time the tested probe pads 14*c* are removed and the outer lead portions 14*bo* are "formed" into a shaped desire for printed circuit board mounting. The lead-formed units are then shipped to customers in slide carriers. The slide carriers (not shown) provide protection from mechanical and electrical damage.

While the invention has been described in connection with several exemplary embodiments, it will be understood that many modifications will be apparent to those of ordinary skill in the art in light of the above without going beyond the scope of the invention. Such modifications may include using substitute materials, smaller dimensions, more than one die in a package, a variety of different shapes for conductors, insulators and so forth to achieve substantially the same results in substantially the same way. Reference to the following claims should be made to determine the scope of the claimed invention.

We claim:

1. A package for encapsulating a semiconductor device comprising:
    a flexible substrate having a patterned insulative layer defined at a top side thereof and a patterned metal layer defined at a bottom side thereof;
    a backside layer, made of a first moisture-blocking material, connected to the bottom side of the flexible substrate;
    a casting frame, made of a second moisture-blocking material, positioned above the top side of the flexible substrate; and
    a sealing ring, made of a third moisture-blocking material, positioned between an edge of the casting frame and the flexible substrate sealingly connecting the flexible substrate intermediate the backside layer and the casting frame.

2. The package of claim 1 wherein the casting frame is composed of metal.

3. The package of claim 2 wherein the casting frame includes aluminum.

4. The package of claim 3 wherein the casting frame is composed of anodized aluminum.

5. The package of claim 1 wherein an inner surface of the casting frame is inclined at an angle greater than 90° relative to a top surface of the casting frame.

* * * * *